US012696006B2

(12) United States Patent
Shinohara

(10) Patent No.: US 12,696,006 B2
(45) Date of Patent: Jul. 28, 2026

(54) PHOTOELECTRIC CONVERSION DEVICE

(71) Applicant: CANON KABUSHIKI KAISHA,
Tokyo (JP)

(72) Inventor: Mahito Shinohara, Tokyo (JP)

(73) Assignee: CANON KABUSHIKI KAISHA,
Tokyo (JP)

( * ) Notice: Subject to any disclaimer, the term of this
patent is extended or adjusted under 35
U.S.C. 154(b) by 89 days.

(21) Appl. No.: 18/444,419

(22) Filed: Feb. 16, 2024

(65) Prior Publication Data

US 2024/0284064 A1 Aug. 22, 2024

(30) Foreign Application Priority Data

Feb. 20, 2023 (JP) ................................. 2023-024211

(51) Int. Cl.
*H04N 25/63* (2023.01)
*G01S 7/4863* (2020.01)
(Continued)

(52) U.S. Cl.
CPC ........... *H04N 25/63* (2023.01); *G01S 7/4863*
(2013.01); *G01S 17/894* (2020.01); *H04N
25/77* (2023.01);
(Continued)

(58) Field of Classification Search
CPC ........ H04N 25/63; H04N 25/77; H04N 25/79;
H04N 25/709; H04N 25/773; G01S
7/4863; G01S 17/894; H01L 24/08; H01L 2224/08145; H10F 39/1843; H10F
39/8033; H10F 39/807; H10F 39/12;
H10W 90/792; H10W 72/90
See application file for complete search history.

(56) References Cited

U.S. PATENT DOCUMENTS

2015/0034808 A1* 2/2015 Yuan ......................... G01J 1/44
250/214.1
2019/0146100 A1 5/2019 O'Neill
(Continued)

FOREIGN PATENT DOCUMENTS

JP 2007036513 A 2/2007
JP 2020047780 A 3/2020

*Primary Examiner* — Michael E Teitelbaum
(74) *Attorney, Agent, or Firm* — Canon U.S.A., Inc. IP
Division

(57) ABSTRACT

A photoelectric conversion device includes a photoelectric
conversion unit including a first semiconductor region, a
second semiconductor region, and a third semiconductor
region forming a p-n junction with the second semiconduc-
tor region, and a control circuit for switching a voltage of a
reverse bias voltage applied between the first and the second
semiconductor regions between first and second voltages.
The photoelectric conversion device performs a period in
which the reverse bias voltage is set to the first voltage to
accumulate signal charge in the third semiconductor region,
and a period in which the reverse bias voltage is set to the
second voltage to enable transfer of signal charge to the first
semiconductor region, and avalanche multiplication at the
p-n junction between the first and second semiconductor
regions. The control circuit switches between the first volt-
age and the second voltage by changing the reverse bias
voltage to a rectangular shape.

21 Claims, 22 Drawing Sheets

(51) Int. Cl.

| | |
|---|---|
| *G01S 17/894* | (2020.01) |
| *H04N 25/77* | (2023.01) |
| *H04N 25/79* | (2023.01) |
| *H10F 39/00* | (2025.01) |
| *H10F 39/18* | (2025.01) |
| *H10W 90/00* | (2026.01) |

(52) U.S. Cl.
CPC ..... *H10F 39/1843* (2025.01); *H10F 39/8033* (2025.01); *H10F 39/807* (2025.01); *H04N 25/79* (2023.01); *H10W 90/792* (2026.01)

(56) References Cited

U.S. PATENT DOCUMENTS

| | | | |
|---|---|---|---|
| 2020/0091205 A1* | 3/2020 | Shinohara | ............... H10F 39/18 |
| 2021/0176413 A1 | 6/2021 | Inoue | |

* cited by examiner

Figure 16:
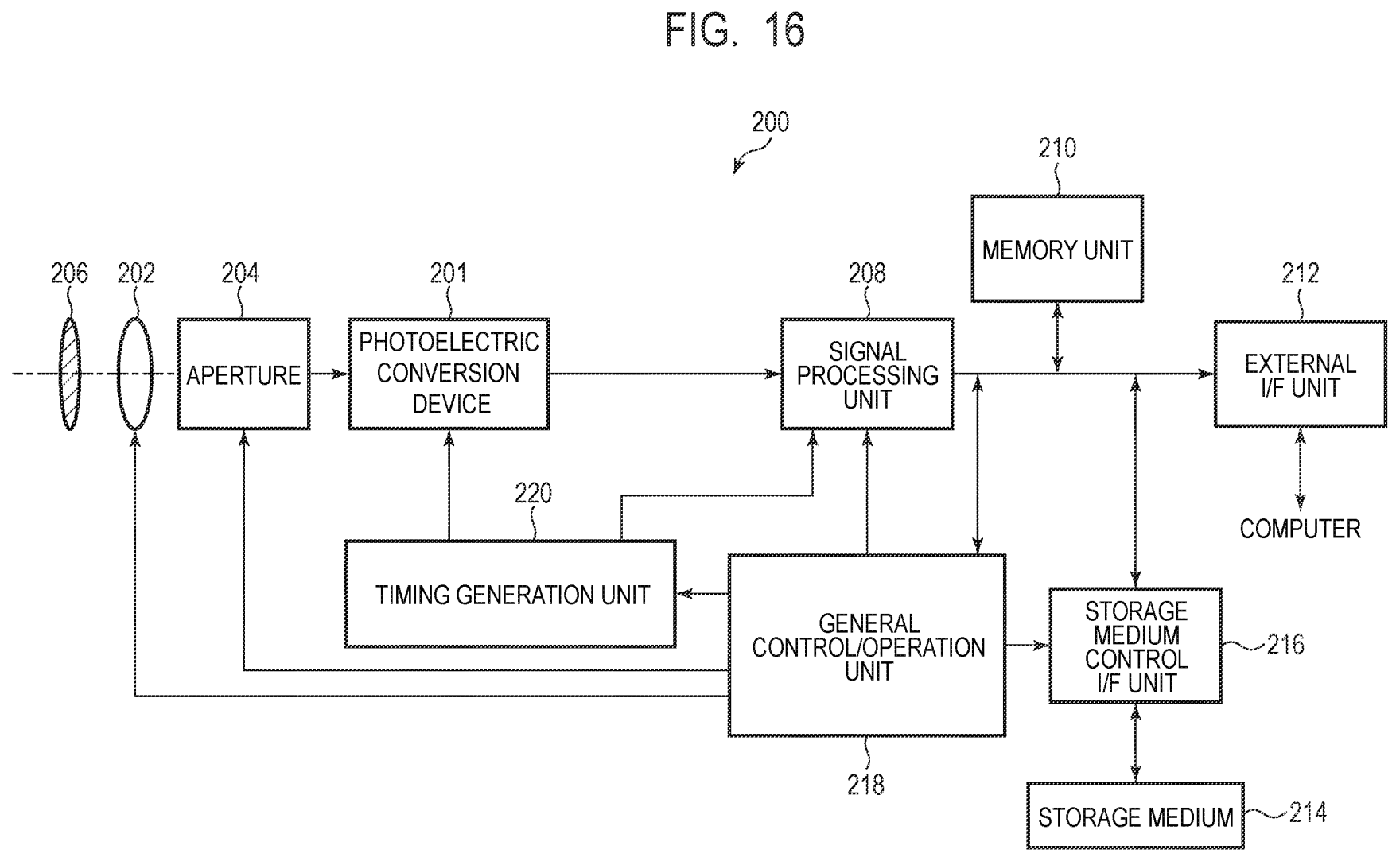

212 EXTERNAL I/F UNIT

COMPUTER

210 MEMORY UNIT

208 SIGNAL PROCESSING UNIT

216 STORAGE MEDIUM CONTROL I/F UNIT

214 STORAGE MEDIUM

218 GENERAL CONTROL/OPERATION UNIT

201 PHOTOELECTRIC CONVERSION DEVICE

220 TIMING GENERATION UNIT

204 APERTURE

Figure 17:
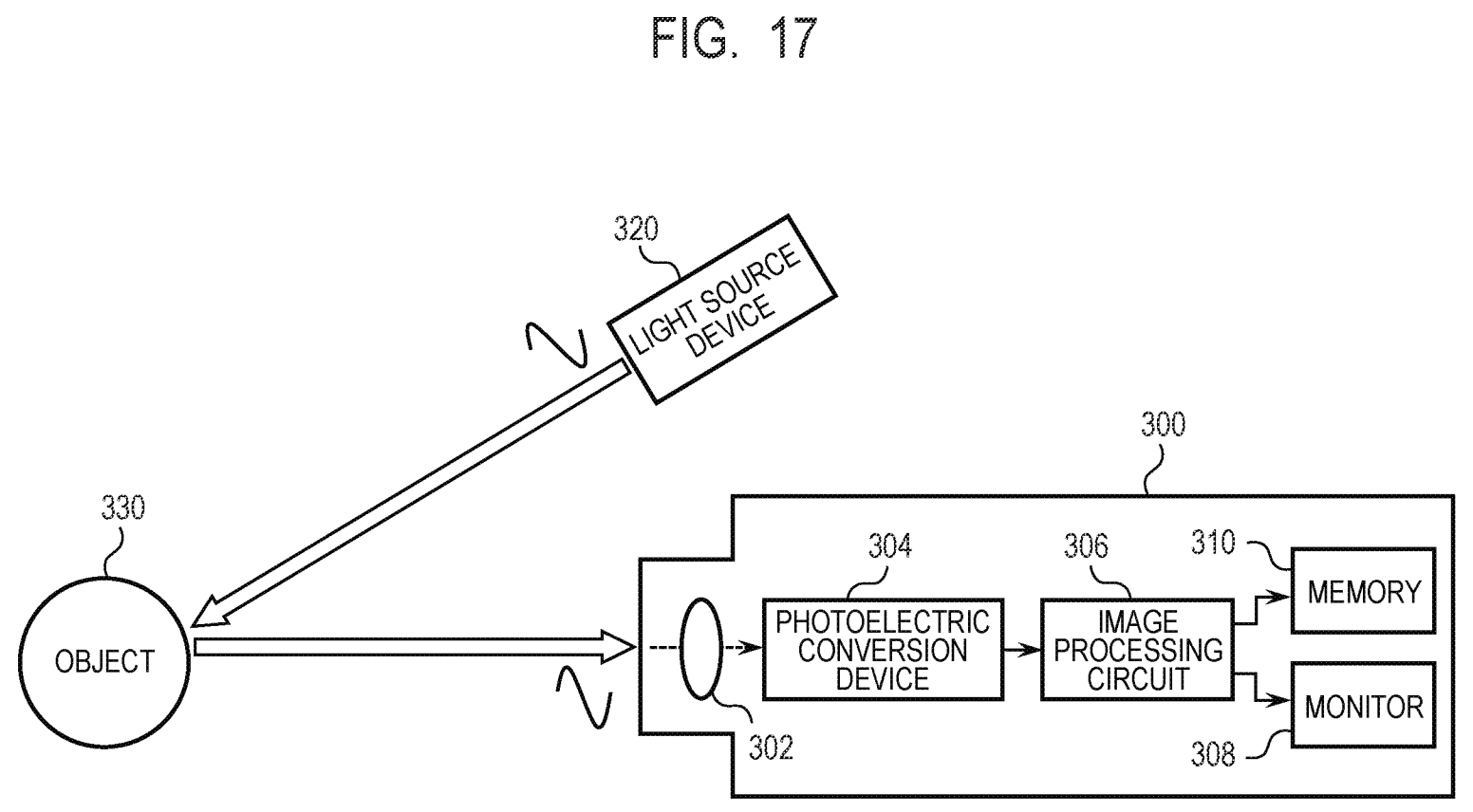

310 MEMORY

308 MONITOR

306 IMAGE PROCESSING CIRCUIT

304 PHOTOELECTRIC CONVERSION DEVICE

302

320 LIGHT SOURCE DEVICE

330 OBJECT

PHOTOELECTRIC CONVERSION DEVICE

BACKGROUND

Field

One disclosed aspect of the embodiments relates to a photoelectric conversion device.

Description of the Related Art

The SPAD (Single Photon Avalanche Diode) is known as a detector capable of detecting weak light at single photon level. The SPAD multiplies signal charges excited by a photon several times to several million times through avalanche multiplication phenomenon generated by a strong electric field induced in a p-n junction of semiconductors. By converting a current generated by the avalanche multiplication phenomenon into a pulse signal and counting the number of pulse signals, the number of incident photons may be directly measured. Japanese Patent Application Laid-Open No. 2020-047780 discloses a photodetection device configured to accumulate signal charge generated by photoelectric conversion, transfer the accumulated signal charge to an avalanche diode, and convert the generated avalanche current into a pulse signal.

However, in the photodetection device described in Japanese Patent Application Laid-Open No. 2020-047780, since the readout voltage gradually changes so that a plurality of accumulated signal charges is not transferred at the same time, there is a concern that the signal readout operation period becomes long and the dark output due to the dark electrons increases.

SUMMARY

One embodiment of the disclosure provides a photoelectric conversion device capable of greatly reducing a dark output due to dark electrons without lowering sensitivity or a saturation signal amount.

According to an embodiment of the present disclosure, a photoelectric conversion device includes a photoelectric conversion unit and a control circuit. The photoelectric conversion unit includes a first semiconductor region, a second semiconductor region, and a third semiconductor region. The first semiconductor region is of a first conductivity type having carriers of the same polarity as a signal charge as majority carriers. The second semiconductor region is of a second conductivity type forming a p-n junction with the first semiconductor region. The third semiconductor region is of the first conductivity type forming a p-n junction with the second semiconductor region. The control circuit is configured to switch a reverse bias voltage applied between the first semiconductor region and the second semiconductor region between a first voltage and a second voltage larger than the first voltage. The photoelectric conversion device is configured to perform a signal accumulation operation period and a signal readout operation period. The signal accumulation operation period accumulates a signal charge generated by an incidence of a photon on the photoelectric conversion unit in the third semiconductor region by setting the reverse bias voltage to the first voltage. The signal readout operation period enables a transfer of the signal charge from the third semiconductor region to the first semiconductor region and an avalanche multiplication at the p-n junction between the first semiconductor region and the second semiconductor region by setting the reverse bias voltage to the second voltage. The control circuit is configured to switch the reverse bias voltage between the first voltage and the second voltage by changing a waveform in a rectangular shape.

Further features of the disclosure will become apparent from the following description of exemplary embodiments with reference to the attached drawings.

BRIEF DESCRIPTION OF THE DRAWINGS

FIG. 3 is a block diagram illustrating a configuration example of a pixel in the photoelectric conversion device according to the first embodiment.

FIG. 5A, FIG. 5B, and FIG. 5C are diagrams explaining a basic operation of the pixel in the photoelectric conversion device according to the first embodiment.

FIG. 8 is an equivalent circuit diagram of a main part of the pixel in the photoelectric conversion device according to the first embodiment.

FIG. 16 is a block diagram illustrating a schematic configuration of a photodetection system according to a fourth embodiment.

FIG. 17 is a block diagram illustrating a schematic configuration of a range image sensor according to a fifth embodiment.

DESCRIPTION OF THE EMBODIMENTS

Figure 1:
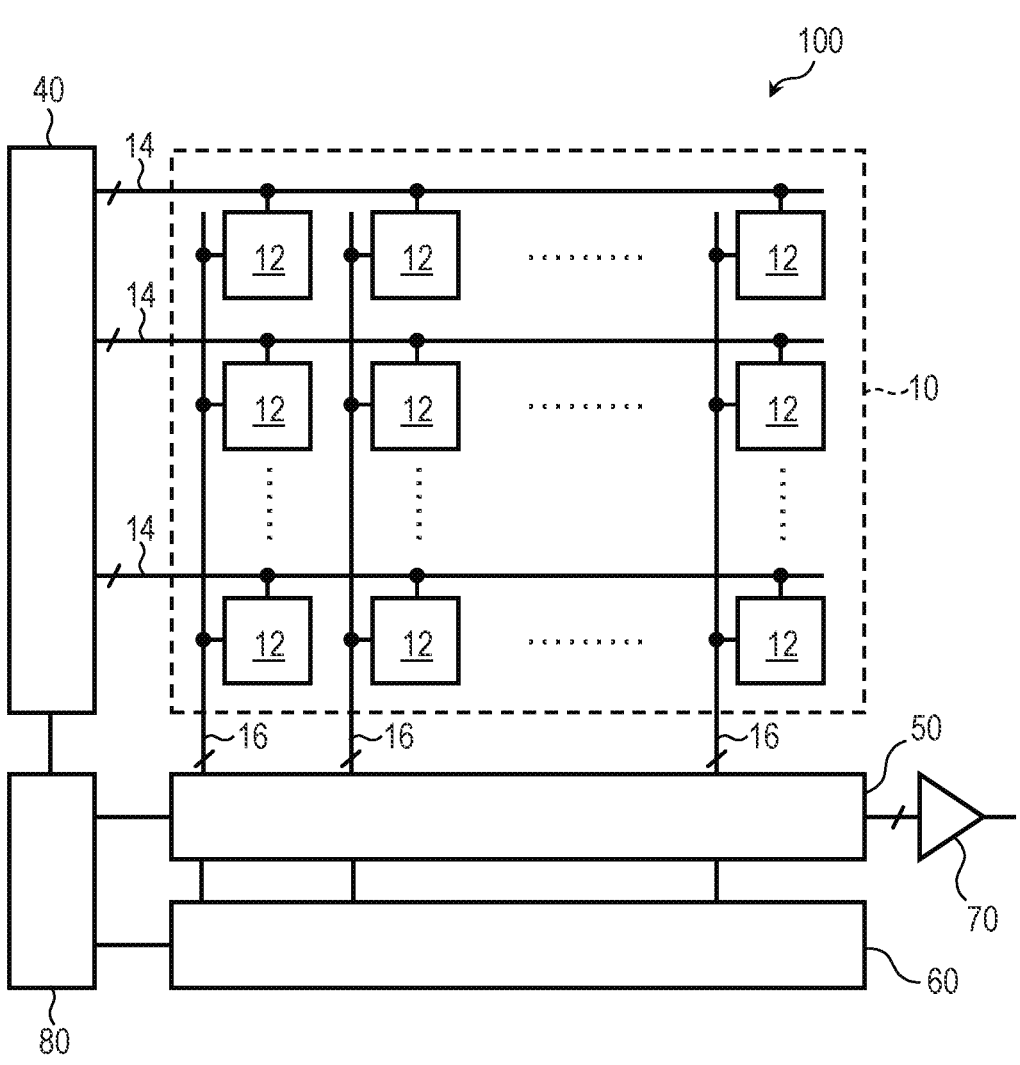
FIG. 1 and FIG. 2 are block diagrams illustrating a schematic configuration of a photoelectric conversion device according to a first embodiment.

Preferred embodiments of the disclosure will now be described in detail in accordance with the accompanying drawings.

The following embodiments are intended to embody the technical idea of the disclosure and do not limit the disclosure. The sizes and positional relationships of the members illustrated in the drawings may be exaggerated or understated for clarity of explanation. In addition, the term "unit" may refer to a circuit, a device, or an assembly in a hardware context. In the following description, the same components are denoted by the same reference numerals, and description thereof may be omitted.

First Embodiment

Figure 2:
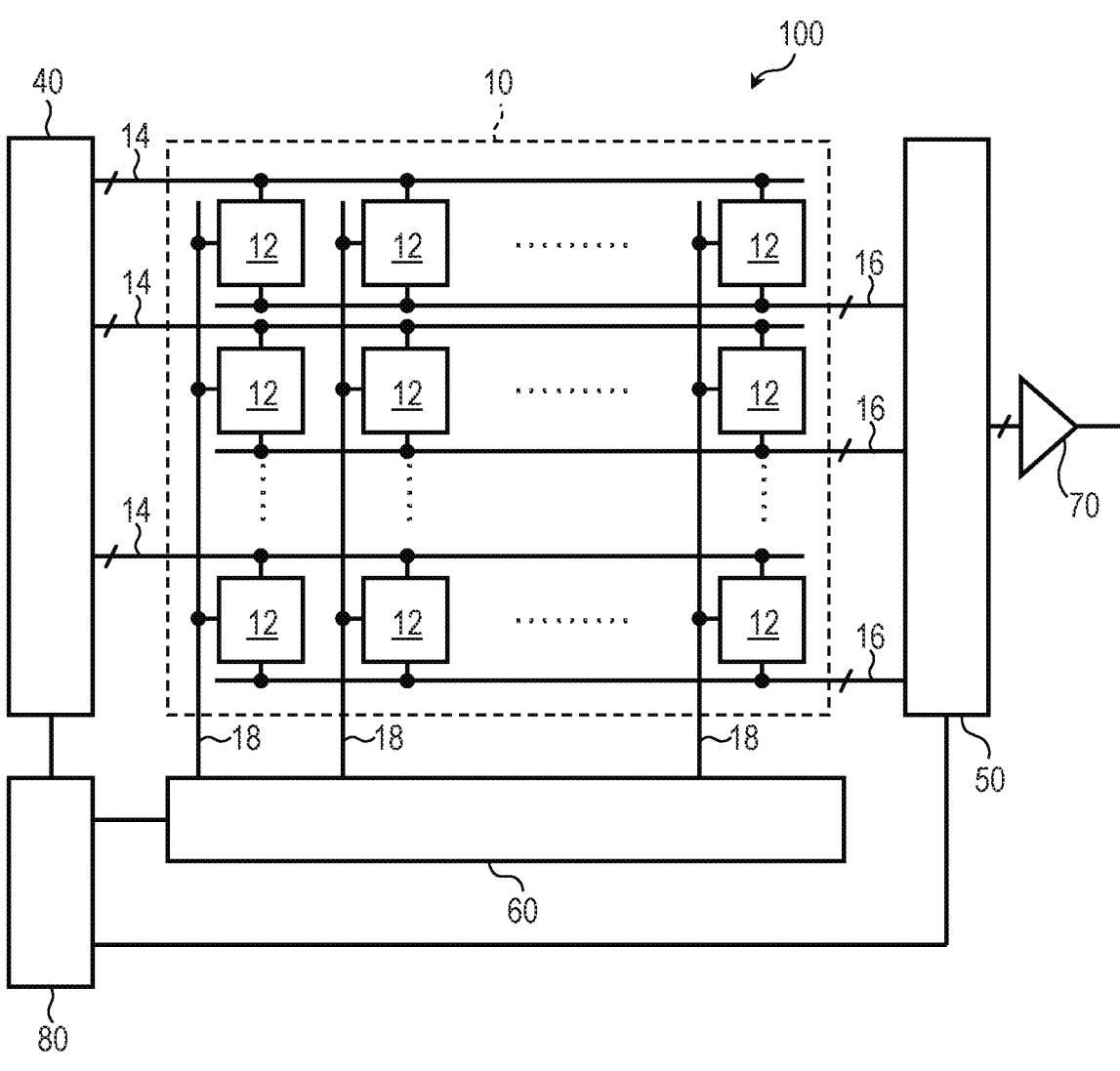
Figure 3:
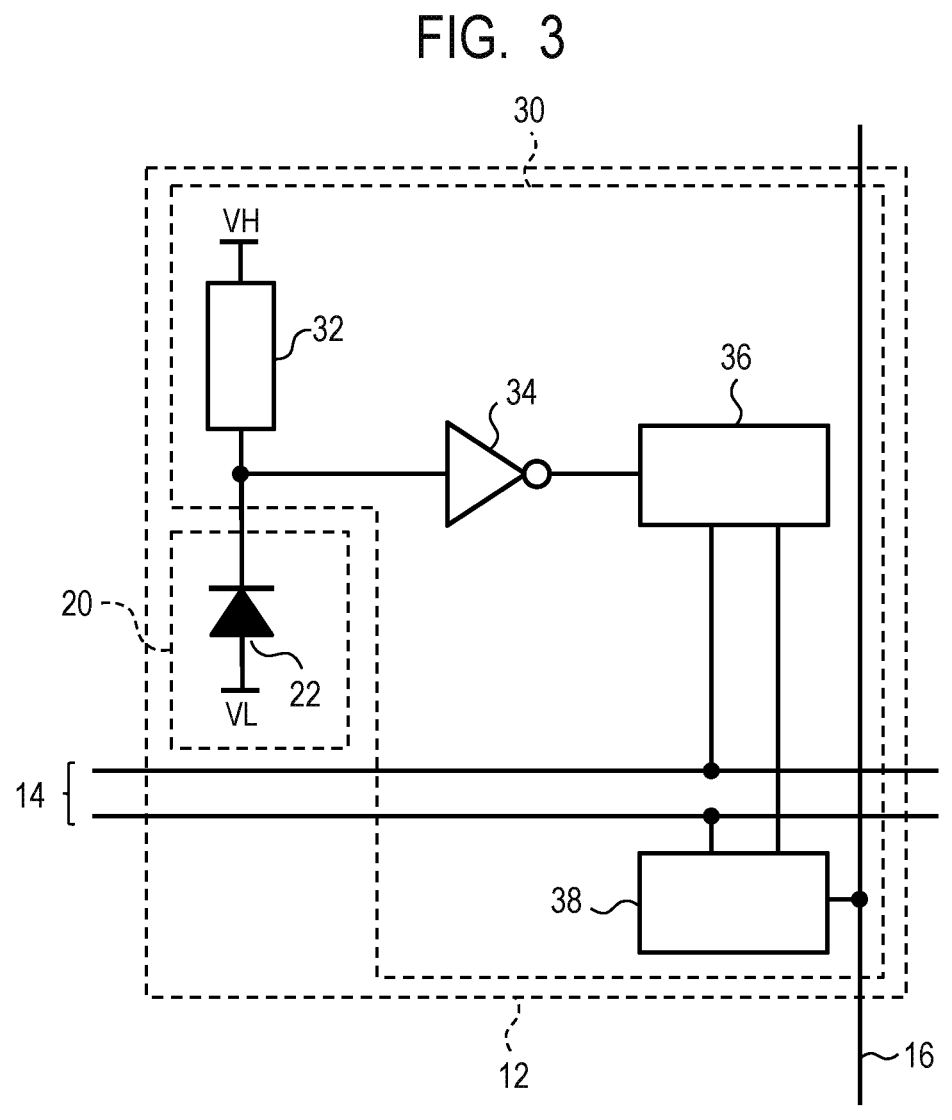
Figure 4:
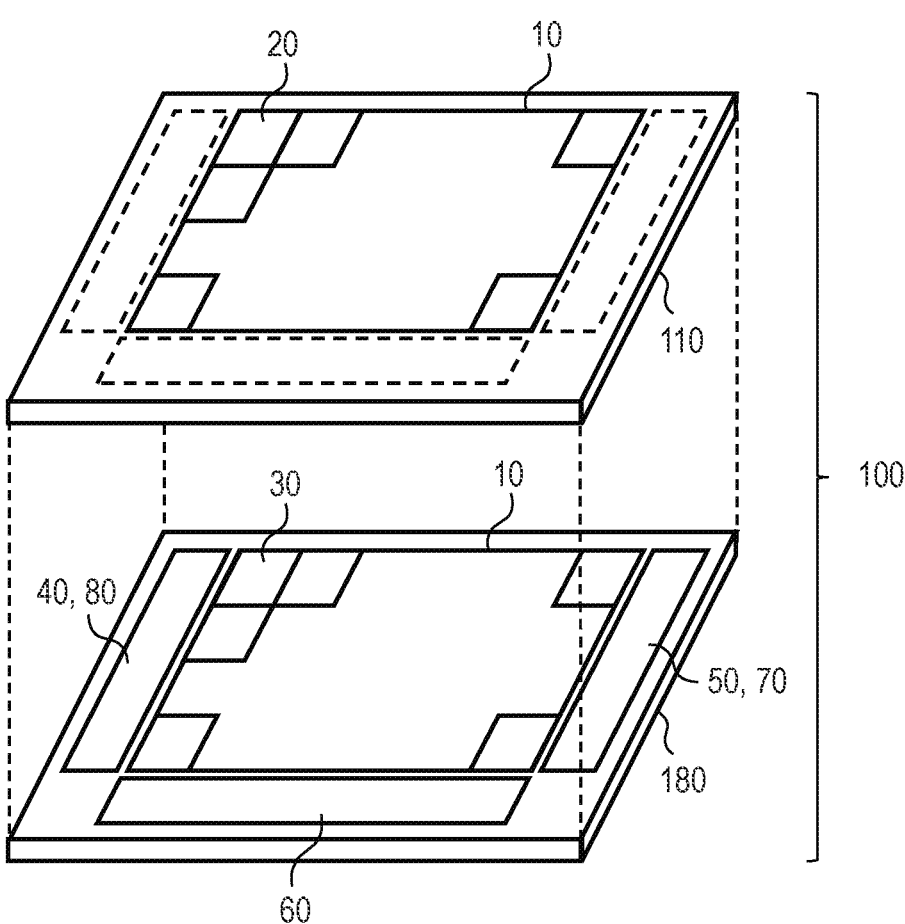
FIG. 4 is a perspective view illustrating a configuration example of the photoelectric conversion device according to the first embodiment.

A schematic configuration of a photoelectric conversion device according to a first embodiment will be described with reference to FIG. 1 to FIG. 4. FIG. 1 and FIG. 2 are block diagrams illustrating a schematic configuration of a photoelectric conversion device according to the present embodiment. FIG. 3 is a block diagram illustrating a configuration example of a pixel in the photoelectric conversion device according to the present embodiment. FIG. 4 is a perspective view illustrating a configuration example of the photoelectric conversion device according to the present embodiment.

As illustrated in FIG. 1, the photoelectric conversion device 100 according to the present embodiment includes a pixel unit 10, a vertical scanning circuit unit 40, a readout circuit unit 50, a horizontal scanning circuit unit 60, and output circuit unit 70, and a control pulse generation unit 80.

The pixel unit 10 is provided with a plurality of pixels 12 arranged in an array so as to form a plurality of rows and a plurality of columns. Each pixel 12 may include a photoelectric conversion unit including a photoelectric conversion element and a signal processing circuit unit that processes a signal output from the photoelectric conversion unit, as will be described later. The number of pixels 12 constituting the pixel unit 10 is not particularly limited. For example, the pixel unit 10 may be configured by a plurality of pixels 12 arranged in an array of several thousands of rows and several thousands of columns as in a general digital camera. Alternatively, the pixel unit 10 may include a plurality of pixels 12 arranged in one row or one column. Alternatively, the pixel unit 10 may be constituted by one pixel 12.

In each row of the pixel array of the pixel unit 10, a control line 14 is arranged extending in a first direction (a lateral direction in FIG. 1). Each of the control lines 14 is connected to the pixels 12 arranged in the first direction on the corresponding row, and serves as a signal line common to these pixels 12. The first direction in which the control lines 14 extend may be referred to as a row direction or a horizontal direction. Each of the control lines 14 may include a plurality of signal lines for supplying a plurality of types of control signals to the pixels 12. The control line 14 in each row is connected to the vertical scanning circuit unit 40.

In addition, in each column of the pixel array of the pixel unit 10, an output line 16 is arranged so as to extend in a second direction (a vertical direction in FIG. 1) intersecting with the first direction. Each of the output lines 16 is connected to the pixels 12 arranged in the second direction on the corresponding column, and serves as a signal line common to these pixels 12. The second direction in which the output lines 16 extend may be referred to as a column direction or a vertical direction. Each of the output lines 16 may include a plurality of signal lines for transferring, e.g., a digital signal of a plurality of bits output from the pixel 12 bit by bit.

The control line 14 in each row is connected to the vertical scanning circuit unit 40. The vertical scanning circuit unit 40 is a control unit having a function of receiving control signals output from the control pulse generation unit 80, generating control signals for driving the pixels 12, and supplying the generated control signals to the pixels 12 via the control lines 14. A logic circuit such as a shift register or an address decoder may be used for the vertical scanning circuit unit 40. The vertical scanning circuit unit 40 sequentially scans the pixels 12 in the pixel unit 10 in units of rows, and outputs pixel signals of the pixels 12 to the readout circuit unit 50 via the output lines 16.

The output line 16 of each column is connected to the readout circuit unit 50. The readout circuit unit 50 includes a plurality of holding units (not illustrated) provided corresponding to each column of the pixel array of the pixel unit 10, and has a function of holding the pixel signals of the pixels 12 of each column output from the pixel unit 10 in units of rows via the output lines 16 in the holding units of the corresponding columns.

The horizontal scanning circuit unit 60 is a control unit that receives control signals output from the control pulse generation unit 80, generates control signals for reading out the pixel signal from the holding unit of each column of the readout circuit unit 50, and supplies the generated control signals to the readout circuit unit 50. A logic circuit such as a shift register or an address decoder may be used for the horizontal scanning circuit unit 60. The horizontal scanning circuit unit 60 sequentially scans the holding units of the respective columns of the readout circuit unit 50, and sequentially outputs the pixel signals held in the respective columns to the output circuit unit 70.

The output circuit unit 70 is a circuit unit that includes an external interface circuit and outputs the pixel signal output from the readout circuit unit 50 to the outside of the photoelectric conversion device 100. The external interface circuit included in the output circuit unit 70 is not particularly limited. A SerDes (SERializer/DESerializer) transmission circuit such as a LVDS (Low Voltage Differential Signaling) circuit or a SLVS (Scalable Low Voltage Signaling) circuit may be applied to the external interface circuit.

The control pulse generation unit 80 is a control circuit for generating control signals for controlling the operations and timings of the vertical scanning circuit unit 40, the readout circuit unit 50, and the horizontal scanning circuit unit 60, and supplying the generated control signals to each functional block. At least a part of the control signals for controlling the operations and timings of the vertical scanning circuit unit 40, the readout circuit unit 50, and the horizontal scanning circuit unit 60 may be supplied from the outside of the photoelectric conversion device 100.

The connection mode of each functional block of the photoelectric conversion device 100 is not limited to the configuration example illustrated in FIG. 1, and may be configured as illustrated in FIG. 2, for example.

In the configuration example of FIG. 2, the output lines 16 extending in the first direction are arranged in each row of the pixel array of the pixel unit 10. Each of the output lines 16 is connected to the pixels 12 arranged in the first direction on the corresponding row, and serves as a signal line common to these pixels 12. In addition, control lines 18 extending in the second direction are arranged in each column of the pixel array of the pixel unit 10. Each of the control lines 18 is connected to the pixels 12 arranged in the second direction on the corresponding column, and serves as a signal line common to these pixels 12.

The control line 18 in each column is connected to the horizontal scanning circuit unit 60. The horizontal scanning circuit unit 60 receives control signals output from the control pulse generation unit 80, generates control signals for reading out the pixel signals from the pixels 12, and supplies the generated control signals to the pixels 12 via the control lines 18. Specifically, the horizontal scanning circuit unit 60 sequentially scans the plurality of pixels 12 of the pixel unit 10 in units of columns, and outputs the pixel signals of the pixels 12 in each row belonging to the selected column to the output lines 16.

The output line 16 of each row is connected to the readout circuit unit 50. The readout circuit unit 50 includes a plurality of holding units (not illustrated) provided corresponding to each row of the pixel array of the pixel unit 10, and has a function of holding the pixel signals of the pixels 12 of each row output from the pixel unit 10 in units of columns via the output lines 16 in the holding units of the corresponding rows.

The readout circuit unit 50 receives the control signal output from the control pulse generation unit 80, and sequentially outputs the pixel signals held in the holding units of the respective rows to the output circuit unit 70.

Other configurations in the configuration example of FIG. 2 may be similar to those in the configuration example of FIG. 1.

As illustrated in FIG. 3, each pixel 12 may include a photoelectric conversion unit 20 and a signal processing circuit unit 30. The photoelectric conversion unit 20 is a functional block that converts incident light into an electric signal, and includes a photoelectric conversion element. The signal processing circuit unit 30 is a functional block that performs predetermined signal processing on the signal output from the photoelectric conversion unit 20, and may be configured by, for example, a quenching element 32, a waveform shaping circuit 34, a counter circuit 36, and a selection circuit 38. The signal processing circuit unit 30 is not particularly limited, and may include any one of the quenching element 32, the waveform shaping circuit 34, the counter circuit 36, and the selection circuit 38.

The photoelectric conversion unit 20 may include an avalanche photodiode (hereinafter referred to as "APD") 22. An anode of the APD 22 is connected to a node to which a voltage VL is supplied. A cathode of the APD 22 is connected to one terminal of the quenching element 32. A connection node between the APD 22 and the quenching element 32 is an output node of the photoelectric conversion unit 20. The other terminal of the quenching element 32 is connected to a node to which a voltage VH higher than the voltage VL is supplied. The voltage VL and the voltage VH are set such that a reverse bias voltage sufficient for the APD 22 to perform an avalanche multiplication operation is applied. In one example, a negative high voltage is applied as the voltage VL, and a positive voltage about a power supply voltage is applied as the voltage VH. For example, the voltage VL is −30 V and the voltage VH is 3 V.

The photoelectric conversion unit 20 may include the APD 22 as described above. By supplying a reverse bias voltage sufficient to perform the avalanche multiplication operation to the APD 22, charge generated by light incidence cause avalanche multiplication, and an avalanche current is generated. The operation modes in a state where the reverse bias voltage is supplied to the APD include a Geiger mode and a linear mode. The Geiger mode is an operation mode in which the voltage applied between the anode and the cathode is set to a reverse bias voltage larger than a breakdown voltage of the APD. The linear mode is an operation mode in which the voltage applied between the anode and the cathode is set to a reverse bias voltage close to or lower than the breakdown voltage of the APD. The APD operating in the Geiger mode is called SPAD (Single Photon Avalanche Diode). The APD 22 constituting the photoelectric conversion unit 20 may operate in the linear mode or the Geiger mode. Hereinafter, the operation in the Geiger mode will be described.

In the present embodiment, a signal is extracted from the cathode side of the APD 22. Therefore, a semiconductor region of a first conductivity type in which a charge having the same polarity as the signal charge is a majority carrier is an n-type semiconductor region, and a semiconductor region of a second conductivity type in which a charge having a polarity different from the signal charge is a majority carrier is a p-type semiconductor region. The carriers of the first conductivity type are electrons, and the carriers of the second conductivity type are holes. The disclosure is also applicable to the case where a signal is extracted from the anode side of the APD 22. In this case, the semiconductor region of the first conductivity type in which a charge having the same polarity as the signal charge is a majority carrier is a p-type semiconductor region, and the semiconductor region of the second conductivity type in which a charge having a polarity different from the signal charge is a majority carrier is an n-type semiconductor region. Although the case where one node of the APD is set to a fixed potential will be described below, the potentials of both nodes may be varied as long as the potential difference between the anode and the cathode of the APD 22 has a relationship described later.

The quenching element 32 has a function of converting a change in the avalanche current generated in the APD 22 into a voltage signal. Further, the quenching element 32 has a function of reducing a voltage applied to the APD 22 to suppress avalanche multiplication by functioning as a load circuit (quenching circuit) when a signal is multiplied by avalanche multiplication. The operation in which the quenching element 32 suppresses avalanche multiplication is called a quenching operation. Further, the quenching element 32 also has a function of returning the voltage supplied to the APD 22 to the voltage VH by passing a current corresponding to the voltage drop by the quenching operation. The operation in which the quenching element 32 returns the voltage supplied to the APD 22 to the voltage VH is called a recharging operation. The quenching element 32 may be configured by a resistive element, a MOS transistor, or the like.

The waveform shaping circuit 34 includes an input node to which an output signal of the photoelectric conversion unit 20 is input, and an output node. The waveform shaping circuit 34 has a function of converting an analog signal output from the photoelectric conversion unit 20 into a pulse signal. The waveform shaping circuit 34 may be configured by a logic circuit including, for example, a NOT circuit (inverter circuit), a NOR circuit, a NAND circuit, and the like. Although FIG. 3 illustrates an example in which one inverter circuit is used as the waveform shaping circuit 34, a circuit in which a plurality of inverter circuits is connected in series may be used. The output node of the waveform shaping circuit 34 is connected to the counter circuit 36.

The counter circuit 36 includes an input node to which an output signal of the waveform shaping circuit 34 is input, an input node connected to the control line 14, and an output node. The counter circuit 36 has a function of counting pulses to be superimposed on a signal output from the waveform shaping circuit 34, and holding a count value as a counting result. The signal supplied from the vertical scanning circuit unit 40 to the counter circuit 36 via the control line 14 may include an enable signal for controlling the pulse counting period, a reset signal for resetting the count value held by the counter circuit 36, and the like.

The output node of the counter circuit 36 is connected to the output line 16 via the selection circuit 38.

The selection circuit 38 has a function of switching an electrical connection state (connection or disconnection) between the counter circuit 36 and the output line 16. The selection circuit 38 switches the connection state between the counter circuit 36 and the output line 16 in accordance with a control signal supplied from the vertical scanning circuit unit 40 via the control line 14 (in the configuration example of FIG. 2, a control signal supplied from the horizontal scanning circuit unit 60 via the control line 18 is used). The selection circuit 38 may further include a buffer circuit for outputting a signal.

The pixel 12 is typically a unit structure that outputs a pixel signal for forming an image. However, when the use of the photoelectric conversion device is intended for distance measurement using a TOF (Time Of Flight) method, the pixel 12 need not necessarily be a unit structure that outputs the pixel signal for forming an image. In this case, the pixel 12 may be a unit structure that outputs a signal for measuring the time at which the light reaches and the amount of light.

It is not necessary that one signal processing circuit unit 30 is provided for each pixel 12, and one signal processing circuit unit 30 may be provided for a plurality of pixels 12.

In this case, the one signal processing circuit unit 30 may be used to sequentially perform the signal processing of the plurality of pixels 12.

The photoelectric conversion device 100 according to the present embodiment may be formed on one substrate, or may be formed as a stacked-type photoelectric conversion device in which a plurality of substrates is stacked. In the latter case, for example, as illustrated in FIG. 4, a sensor substrate 110 and a circuit substrate 180 may be stacked and electrically connected to each other to form a stacked-type photoelectric conversion device. At least the photoelectric conversion unit 20 among the constituent elements of the pixel 12 may be disposed on the sensor substrate 110. The signal processing circuit unit 30 among the constituent elements of the pixel 12 may be disposed on the circuit substrate 180. The photoelectric conversion unit 20 and the signal processing circuit unit 30 are electrically connected to each other via interconnections provided for each pixel 12. The circuit substrate 180 may further include a vertical scanning circuit unit 40, a readout circuit unit 50, a horizontal scanning circuit unit 60, an output circuit unit 70, a control pulse generation unit 80, and the like.

The photoelectric conversion unit 20 and the signal processing circuit unit 30 of each pixel 12 may be provided respectively on the sensor substrate 110 and the circuit substrate 180 so as to overlap each other in a plan view. The vertical scanning circuit unit 40, the readout circuit unit 50, the horizontal scanning circuit unit 60, the output circuit unit 70, and the control pulse generation unit 80 may be disposed around the pixel unit 10 including the plurality of pixels 12. Here, the "plan view" refers to a view from a direction perpendicular to the surface of the sensor substrate 110.

By configuring the stacked-type photoelectric conversion device 100, the degree of integration of elements may be increased and high functionality may be achieved. In particular, by disposing the photoelectric conversion unit 20 and the signal processing circuit unit 30 on different substrates, the photoelectric conversion elements may be disposed at high density without sacrificing the light receiving area of the photoelectric conversion element constituting the photoelectric conversion unit 20, and the photon detection efficiency may be improved.

The number of substrates constituting the photoelectric conversion device 100 is not limited to two, and three or more substrates may be stacked to form the photoelectric conversion device 100.

Although the sensor substrate 110 and the circuit substrate 180 are diced chips in FIG. 4, the sensor substrate 110 and the circuit substrate 180 are not limited to chips. For example, each of the sensor substrate 110 and the circuit substrate 180 may be a wafer. Further, the sensor substrate 110 and the circuit substrate 180 may be stacked in a wafer state and then diced, or may be stacked and bonded after each sensor substrate 110 and the circuit substrate 180 are formed into chips.

Figure 5A:
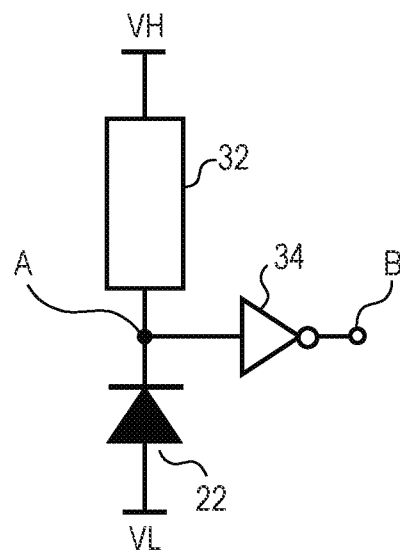
Figure 5B:
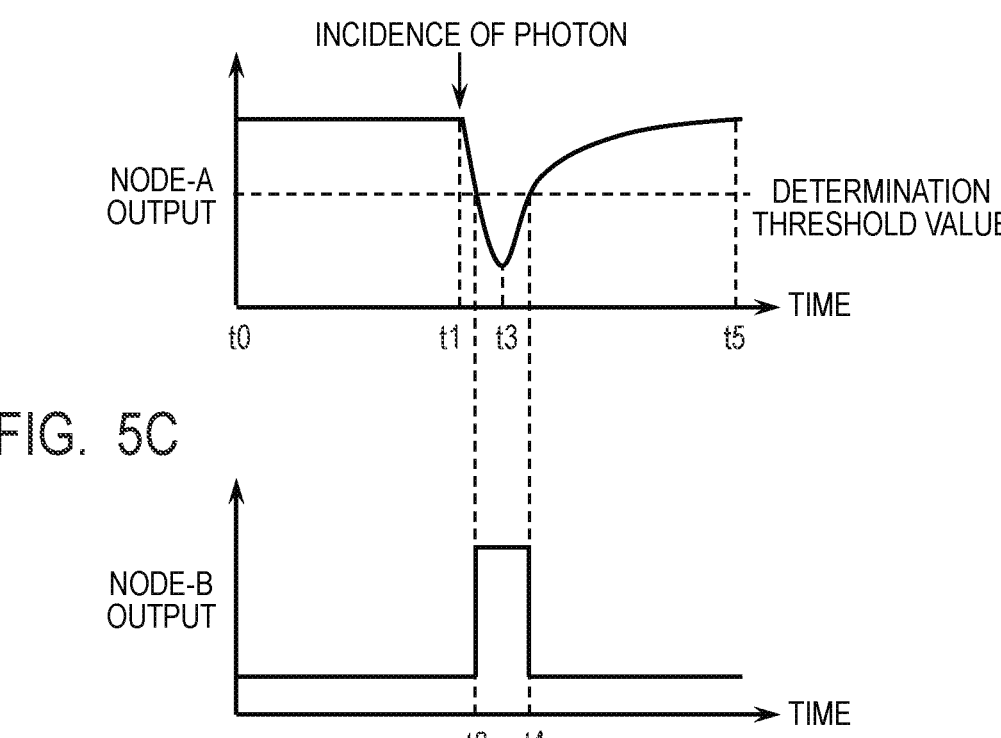

Next, a basic operations of the APD 22, the quenching element 32, and the waveform shaping circuit 34 in the photoelectric conversion device according to the present embodiment will be described with reference to FIG. 5A to FIG. 5C. FIG. 5A to FIG. 5C are diagrams explaining a basic operation of a pixel in the photoelectric conversion device according to the present embodiment. FIG. 5A is a circuit diagram illustrating a portion including the APD 22, the quenching element 32, and the waveform shaping circuit 34 of the pixel 12. FIG. 5B illustrates a waveform of a signal at the output node (node-A) of the photoelectric conversion unit 20, and FIG. 5C illustrates a waveform of a signal at the output node (node-B) of the waveform shaping circuit 34. Here, for simplicity of explanation, the waveform shaping unit 34 is assumed to be an inverter circuit.

At time t0, a reverse bias voltage of a potential difference corresponding to (VH–VL) is applied to the APD 22. Although the reverse bias voltage sufficient to cause avalanche multiplication is applied between the anode and the cathode of the APD 22, avalanche multiplication does not occur because no photon is incident on the APD 22. Therefore, no current flows through the APD 22.

At time t1, it is assumed that a photon enters the APD 22. When the photon is incident on the APD 22, an electron-hole pair is generated by photoelectric conversion, and avalanche multiplication is caused by these carriers, and avalanche current flows through the APD 22. When the avalanche current flows through the quenching element 32, a voltage drop at the quenching element 32 occurs, and the voltage of the node-A begins to drop. When the voltage drop amount of the node-A increases and the avalanche multiplication stops at time t3, the voltage level of the node-A does not drop any further.

When the avalanche multiplication in the APD 22 stops, a current that compensates the voltage drop flows from the node to which the voltage VH is supplied to the node-A via the quenching element 32, and the voltage of the node-A gradually increases. Then, at time t5, node-A is settled to the voltage level VH.

The waveform shaping circuit 34 binarizes the signal input from the node-A according to a predetermined determination threshold value, and outputs a signal from the node-B. Specifically, the waveform shaping circuit 34 outputs a low-level signal from the node-B when the voltage level of the node-A exceeds the determination threshold value, and outputs a high-level signal from the node-B when the voltage level of the node-A is lower than the determination threshold value. For example, as illustrated in FIG. 5B, it is assumed that the voltage of the node-A is equal to or lower than the determination threshold value during a period from the time t2 to the time t4. In this case, as illustrated in FIG. 5C, the signal level at the node-B becomes low-level during the period from the time t0 to the time t2, and during the period from the time t4 to the time t5, and becomes high-level during the period from the time t2 to the time t4.

Thus, the analog signal input from the node-A is shaped, converted, or transformed into a digital signal by the waveform shaping circuit 34. A pulse signal output from the waveform shaping circuit 34 in response to incidence of the photon on the APD 22 is a photon detection pulse signal. The waveform shaping circuit 34 may also be referred to as an avalanche multiplication detection circuit that detects an avalanche multiplication operation in the APD 22 and outputs a pulse signal.

Figure 6:
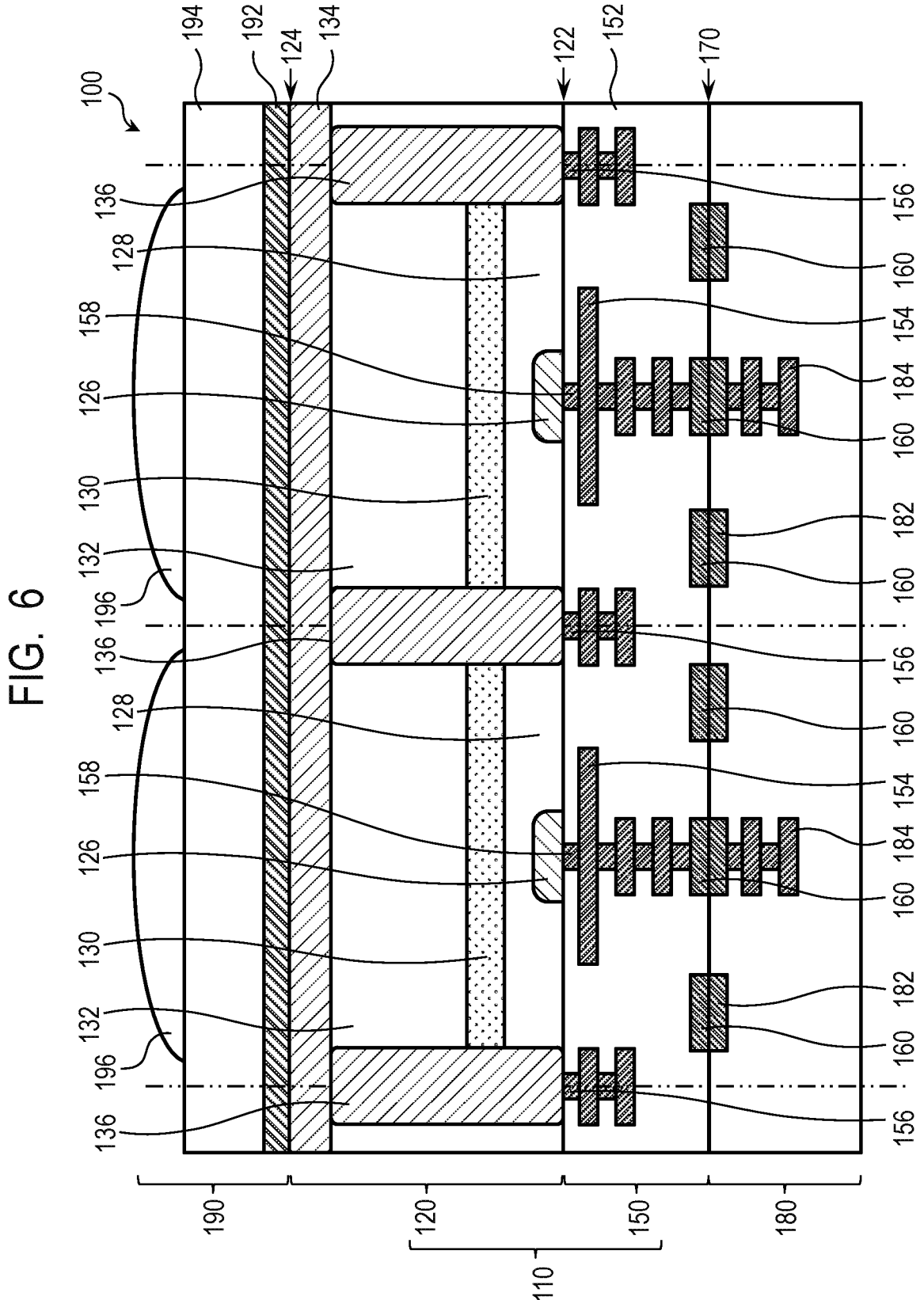
FIG. 6 is a schematic cross-sectional view illustrating a structure of the photoelectric conversion device according to the first embodiment.
Figure 7:
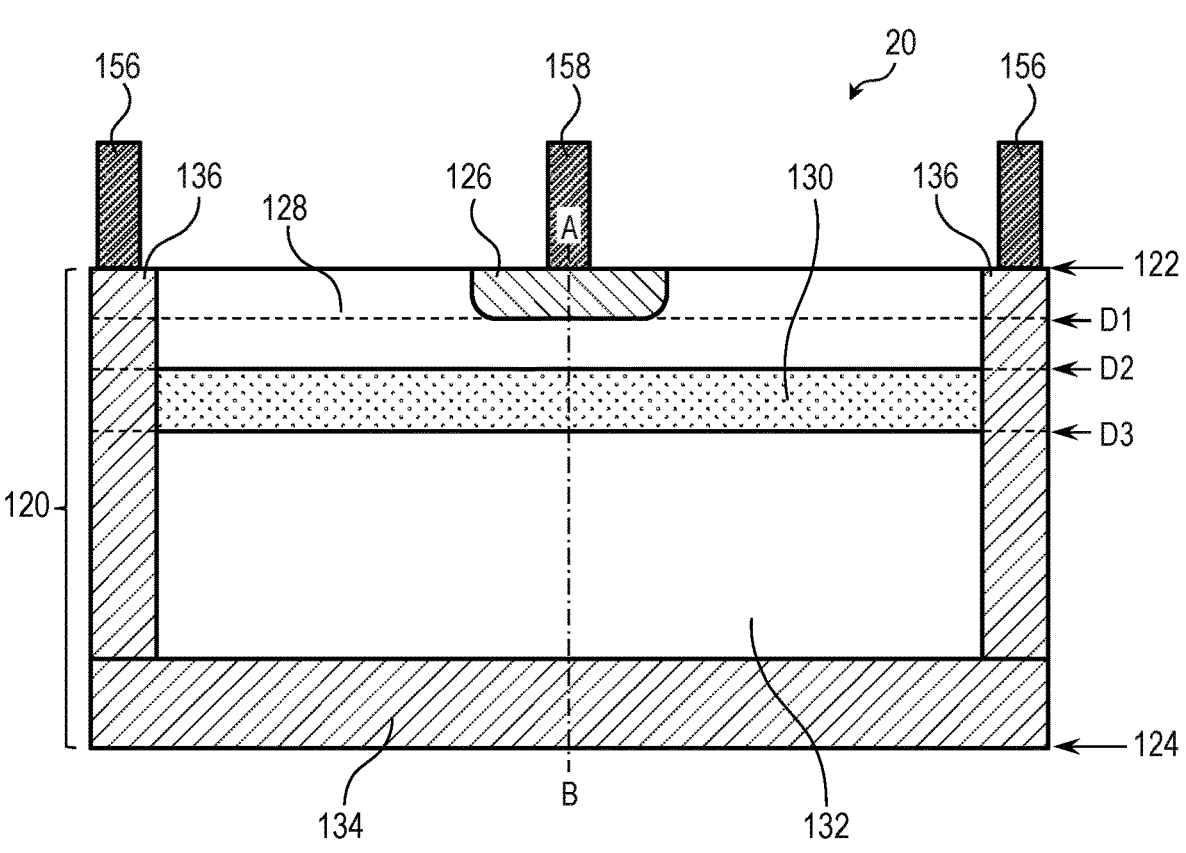
FIG. 7 is a schematic cross-sectional view illustrating a structure of a photoelectric conversion unit in the photoelectric conversion device according to the first embodiment.
Figure 8:
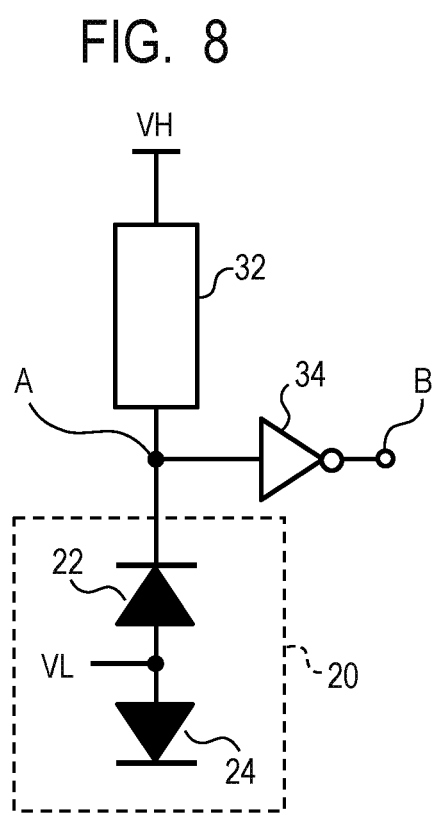

Next, a specific element structure of the photoelectric conversion device 100 according to the present embodiment will be described with reference to FIG. 6 to FIG. 8. FIG. 6 is a schematic cross-sectional view illustrating a structure of the photoelectric conversion device according to the present embodiment. FIG. 6 illustrates a schematic configuration of two pixels 12 arranged adjacent to each other among the plurality of pixels 12 constituting the pixel unit 10. A two-dot-chain line illustrated in FIG. 6 indicates a boundary between adjacent pixels 12. FIG. 7 is a schematic cross-sectional view illustrating a structure of a photoelectric conversion unit in the photoelectric conversion device according to the present embodiment. FIG. 7 illustrates a part of the photoelectric conversion unit 20 among the constituent elements of the pixel 12. FIG. 8 is an equivalent circuit diagram of a main part of the pixel in the photoelectric conversion device according to the present embodiment.

As illustrated in, e.g., FIG. 6, the photoelectric conversion device 100 may be configured as a stacked-type photoelectric conversion device in which the sensor substrate 110 and the circuit substrate 180 are stacked. The sensor substrate 110 includes a semiconductor layer 120 having a first surface 122 and a second surface 124 opposed to the first surface 122, and an interconnection structure layer 150 provided on a side of the first surface 122 of the semiconductor layer 120.

An optical structure layer 190 may be disposed on a side the second surface 124 of the semiconductor layer 120. The circuit substrate 180 is stacked on a side of the interconnection structure layer 150 of the sensor substrate 110. The bonding surface 170 in FIG. 6 is a bonding portion between the sensor substrate 110 and the circuit substrate 180. In the photoelectric conversion device according to the present embodiment, the second surface 124 side of the semiconductor layer 120 provided with the optical structure layer

190 serves as a light receiving surface for receiving light to be detected. That is, the photoelectric conversion device according to the present embodiment is a so-called back-illuminated photoelectric conversion device.

At least the photoelectric conversion unit 20 among the constituent elements of the pixel 12 may be provided in the semiconductor layer 120. The semiconductor layer 120 is formed by thinning a single crystalline silicon substrate, for example, and contains an n-type impurity or a p-type impurity at a predetermined concentration. In the present embodiment, as an example, a semiconductor layer 120 in which an n-type silicon substrate having a low impurity density is thinned is assumed.

As illustrated in FIG. 6 and FIG. 7, the semiconductor layer 120 is provided with n-type semiconductor regions 126, 128 and 132, and p-type semiconductor regions 130, 134 and 136. The p-type semiconductor region 134 is provided on a side of the second surface 124 of the semiconductor layer 120 in a cross-sectional view. The p-type semiconductor region 134 is provided over the entire region where the photoelectric conversion unit 20 is disposed, and overlaps the n-type semiconductor regions 126, 128, and 132 and the p-type semiconductor regions 134 and 136 in a plan view. When a back-illuminated photoelectric conversion device is configured, the p-type semiconductor region 134 is preferably disposed so as to be in contact with the second surface 124. With this configuration, generation of a dark current at the second surface 124 may be prevented. The p-type semiconductor region 136 is provided at a boundary portion between the photoelectric conversion units 20 of the adjacent pixels 12. In other words, the p-type semiconductor region 136 is provided so as to surround each region where the photoelectric conversion unit 20 is disposed in the plan view. The p-type semiconductor region 136 is provided from the first surface 122 of the semiconductor layer 120 to a depth at which the p-type semiconductor region 134 is disposed. Although one photoelectric conversion unit 20 is disposed in each of the regions surrounded by the p-type semiconductor region 136 in FIG. 6, two or more photoelectric conversion units 20 may be disposed in each of the regions surrounded by the p-type semiconductor region 136.

The n-type semiconductor regions 126, 128, and 132 and the p-type semiconductor region 130 are provided inside the region surrounded by the p-type semiconductor regions 134 and 136. The n-type semiconductor region 126 is provided on a side the first surface 122 of the semiconductor layer 120 so as to be separated from the p-type semiconductor region 136. The n-type semiconductor region 126 is provided in a region extending from the first surface 122 to a depth D1 closer to the second surface 124 than the first surface 122. The n-type semiconductor region 128 is provided in a region extending from the first surface 122 to a depth D2 closer to the second surface 124 than the depth D1 so as to surround the n-type semiconductor region 126. The n-type semiconductor region 128 is in contact with the n-type semiconductor region 126 and the p-type semiconductor regions 130 and 136 at the peripheral edge portions. The p-type semiconductor region 130 is provided in a region extending from the depth D2 to a depth D3 closer to the second surface 124 than the depth D2. The p-type semiconductor region 130 is in contact with the p-type semiconductor region 136 at the peripheral portion in the plan view. The n-type semiconductor region 132 is provided between the p-type semiconductor region 130 and the p-type semiconductor region 134, and is in contact with the p-type semiconductor regions 130, 134, and 136 at the peripheral edge portions.

In this specification, the term "plan view" refers to a view taken from a normal direction of a light incident surface (the second surface 124) of the semiconductor layer 120 or a surface (the first surface 122) opposite to the light incident surface (the second surface 124). Further, "cross-sectional view" refers to a cut surface parallel to the normal direction of the first surface 122 or the second surface 124 of the semiconductor layer 120 viewed from the normal direction of the cut surface.

The p-n junction between the n-type semiconductor regions 126 and 128, and the p-type semiconductor region 130 constitutes the APD 22. The n-type semiconductor region 126 constitutes a cathode of the APD 22 and contacts a cathode electrode, and is formed of an n-type semiconductor containing a high-density n-type impurity. The n-type semiconductor region 128 is formed of an n-type semiconductor whose impurity density is lower than that of the n-type semiconductor region 126. The p-type semiconductor region 130 is a region serving as an anode of the APD 22, and is formed of a p-type semiconductor containing a p-type impurity. The n-type semiconductor region 132 is a photoelectric conversion region and is a region for storing signal charges (electrons) generated by photoelectric conversion, and is formed of an n-type semiconductor having a low impurity density compared to the n-type semiconductor region 126. A p-n junction between the p-type semiconductor region 130 and the n-type semiconductor region 132 constitutes a photodiode (hereinafter referred to as "PD") 24. That is, the p-type semiconductor region 130 constitutes an anode of the PD 24, and the n-type semiconductor region 132 constitutes a cathode of the PD 24. The p-type semiconductor region 130 is an anode common to the APD 22 and the PD 24. The p-type semiconductor regions 134 and 136 form isolation portions that electrically isolate the APD 22 and the PD 24 of the adjacent pixels 12. That is, the APD 22 and the PD 24 of the adjacent pixels 12 are electrically isolated from each other by the p-type semiconductor regions 134 and 136.

In FIG. 7, the line A-B is a line parallel to the normal direction of the semiconductor layer 120 passing through a center of the n-type semiconductor region 126 in the plan view. A portion between the n-type semiconductor region 126 and the p-type semiconductor region 130 along the line A-B serves as a main transfer path for signal electrons transferred from the PD 24 to the APD 22 when a signal is read out from the photoelectric conversion unit 20.

FIG. 8 is an equivalent circuit diagram of the photoelectric conversion unit 20 illustrated in FIG. 7. That is, the photoelectric conversion unit 20 further includes a PD 24 whose anode is connected to the anode of the APD 22, in addition to the APD 22 described with reference to FIG. 3 and FIG. 5A. The cathode of the PD 24 is in a floating state.

The interconnection structure layer 150 includes an insulating layer 152 and interconnection layers 154 disposed in the insulating layer 152. The interconnection layers 154 include anode electrodes 156 connected to the p-type semiconductor region 136, cathode electrodes 158 connected to the n-type semiconductor region 126, and pad electrodes 160 formed of an interconnection layer most distant from the semiconductor layer 120.

The circuit substrate 180 is stacked on the side of the interconnection structure layer 150 of the sensor substrate 110. A bonding surface 170 in FIG. 6 is a bonding portion between the sensor substrate 110 and the circuit substrate 180.

The circuit substrate 180 includes a semiconductor layer provided with elements such as a transistor and an interconnection structure layer provided on the semiconductor layer. FIG. 6 illustrates only pad electrodes 182 formed of the uppermost interconnection layer among the semiconductor layer and the interconnection structure layer constituting the circuit substrate 180 and a part of the interconnection layers 184 connected to the pad electrodes 182 for simplification of the drawing. The sensor substrate 110 and the circuit substrate 180 may be bonded to each other by, for example, metal bonding between a metal member constituting the pad electrodes 160 and a metal member constituting the pad electrodes 182.

The optical structure layer 190 may include a pinning film 192, a planarization layer 194, and a micro-lens layer including a plurality of micro-lens 196. The optical structure layer 190 may further include a filter layer (not illustrated). Various optical filters such as a color filter, an infrared light cut filter, and a monochrome filter may be applied to the filter layer. Instead of providing the p-type semiconductor region 136 in the semiconductor layer 120, the pinning film 192 may be provided in contact with the second surface 124. Thus, holes may be accumulated on a side of the second surface 124 in the semiconductor layer 120, and generation of dark current may be suppressed. A known material may be applied to the pinning film 192.

Before specifically describing a method of driving the photoelectric conversion device according to the present embodiment, the configuration and operation of the photodetection device described in Japanese Patent Application Laid-Open No. 2020-047780 will be briefly described.

Japanese Patent Application Laid-Open No. 2020-047780 discloses a photodetection device including a photoelectric conversion unit including APD and PD. The photodetection device described in Japanese Patent Application Laid-Open No. 2020-047780 sequentially transfers the signal charges accumulated in the PD to the APD, detects the avalanche current generated by the signal charges, and counts the number of times the avalanche current is detected. In the photodetection device described in Japanese Patent Application Laid-Open No. 2020-047780, after a large number of signal charge carriers are accumulated in the PD, in order to transfer the signal charge carriers one by one to the APD, the reverse bias voltage applied to the APD during the signal readout operation is gradually changed, for example, in a slope shape. Therefore, the value of the reverse bias voltage applied to the APD when the signal charge carrier is transferred varies depending on the timing at which the signal charge carrier is transferred. For example, when the signal charge carrier is transferred immediately after the start of the signal readout operation period and when the signal charge carrier is transferred just before the end of the signal readout operation period, the difference of the reverse bias voltage applied to the APD between them is about 3V.

Here, in the following description, a physical quantity called "avalanche occurrence probability" is defined. The avalanche occurrence probability is a probability that one carrier causes an avalanche multiplication phenomenon in the APD, and depends much on the reverse bias voltage applied to the APD. Although the breakdown voltage Vbd of the APD is defined as a voltage at which the reverse bias current starts to rapidly increase, the breakdown voltage Vbd is also a voltage at which the avalanche occurrence probability starts to rise from zero. When the reverse bias voltage applied to the APD becomes higher than the breakdown voltage Vbd by about 1.0 V or more, the avalanche occurrence probability becomes a sufficiently large value, for example, a value of about 80% or more.

As described above, when the reverse bias voltage applied to the APD is gradually changed during the signal readout operation, the value of the reverse bias voltage applied to the APD when the signal charge carrier is transferred varies depending on the timing at which the signal charge carrier is transferred. Therefore, the signal charge carriers transferred to the APD may include signal charge carriers transferred to the APD in a state where the reverse bias voltage applied to the APD is relatively small, that is, the avalanche occurrence probability is low. The signal charge carriers transferred at such a timing do not cause avalanche multiplication, i.e., the probability of being discharged from the cathode or the like without being detected as a signal increases. In such a situation, the sensitivity and the saturation signal amount decreases as a result.

In addition, when the reverse bias voltage applied to the APD 22 is changed in a slope shape, the height of the potential barrier between the PD 24 and the APD 22 also decreases by a certain amount with time, so that a rate at which the signal charge carriers accumulated in the PD 24 are transferred to the APD 22 is not constant. That is, assuming that Vba is a height of a potential barrier, k is the Boltzmann constant, and T is the absolute temperature, the rate at which the signal charge carriers accumulated in the PD 24 are transferred to the APD 22 beyond the potential barrier is proportional to $\exp(-Vba/kT)$. Therefore, the transfer rate, i.e., an amount of signal transferred to the APD 22 per unit time, largely changes within the signal readout operation period.

At the early stage of the signal readout operation period, the transfer speed of the signal charge carrier is extremely low because the potential barrier is high, but the transfer speed of the signal charge carrier gradually increases with time.

On the other hand, since the amount of the signal charge carriers accumulated in the PD 24 decreases at the end of the signal readout operation period, the transfer rate of the signal charge carriers rapidly decreases. As a result, the transfer rate of the signal charge carrier has a peak within the signal readout operation period. On the other hand, the transfer rate of the signal charge carrier is required to be reduced to a predetermined value or lower. This is because a certain amount of time is required to detect the avalanche multiplication phenomenon, and therefore, if the transfer rate of the signal charge carriers is too high, there is a possibility that each avalanche multiplication phenomenon caused by a plurality of signal charge carriers cannot be distinguished. Therefore, in order to suppress the peak value of the transfer speed to a predetermined value or less, it is required to reduce the slope of the control voltage during the signal readout operation. However, if the slope of the control voltage is decreased, the signal readout operation period becomes longer. In this case, although the length of the signal readout operation period is about several hundred μs to 1 ms, dark electrons generated during the period are detected, and the dark current suppressing effect decreases.

In addition, in the signal readout operation, it has been understood that an avalanche multiplication phenomenon caused by one signal charge carrier causes a phenomenon (hereinafter referred to as a "signal drawing phenomenon") in which another signal charge carrier remaining in the PD 24 is drawn into the APD 24. This is because a large amount of electrons and holes generated by the avalanche multiplication phenomenon change the potential gradient between the APD 22 and the PD 24, and as a result, the potential barrier between the PD 24 and the APD 22 is instantaneously lowered. When a signal drawing phenomenon occurs, a single avalanche detection is performed by simultaneous transfer of a plurality of signal charge carriers, and the saturation signal amount and sensitivity decreases drastically.

Figure 9:
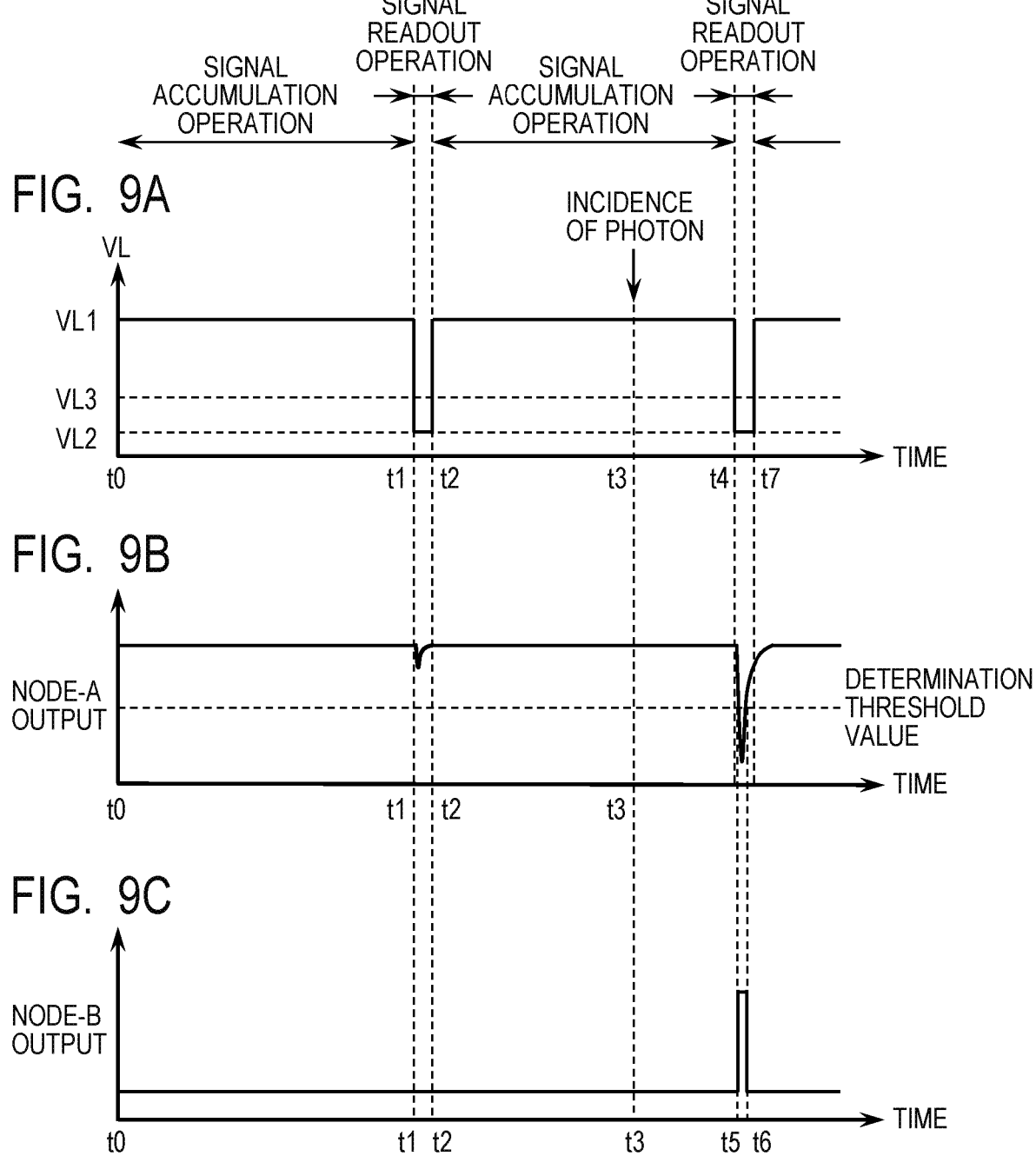
FIG. 9A, FIG. 9B, and FIG. 9C are timing charts illustrating a method of driving the photoelectric conversion device according to the first embodiment.

Next, a method of driving the photoelectric conversion device according to the present embodiment will be described with reference to FIG. 8 to FIG. 9C. FIG. 9A to FIG. 9C are diagrams illustrating a basic operation of the pixel in the photoelectric conversion device according to the present embodiment. FIG. 9A illustrates a waveform of the voltage VL, FIG. 9B illustrates a waveform of the signal at the output node (node-A) of the photoelectric conversion unit 20, and FIG. 9C illustrates a waveform of the signal at the output node (node-B) of the waveform shaping circuit 34. Here, for simplicity of explanation, the waveform shaping circuit 34 is assumed to be an inverter circuit.

In the driving method of the present embodiment, the operation mode of the photoelectric conversion unit 20 is controlled by the voltage VL applied to the anodes of the APD 22 and the PD 24. For example, when the breakdown voltage Vbd of the APD 22 is 30 V and the voltage VH is 3 V, the voltage VL is controlled to the voltage VL1 (e.g., −26 V) or the voltage VL2 (e.g., −30 V). The voltage VL1 is a voltage at which the potential difference between the voltage VH and the voltage VL becomes less than the breakdown voltage Vbd, and the voltage VL2 is a voltage at which the potential difference between the voltage VH and the voltage VL is greater than the breakdown voltage Vbd and the avalanche occurrence probability becomes sufficiently high.

The period in which the voltage VL is set to the voltage VL1 is a signal accumulation operation period in which signal electrons generated by incident light are accumulated in the PD 24. During the signal accumulation operation, the reverse bias voltage applied to the APD 22 is 29 V, which is less than the breakdown voltage Vbd, and even if dark electrons flow through the APD 22, the dark electrons do not cause avalanche multiplication, and thus are not detected. The signal electrons generated by photoelectric conversion in the PD 24 are blocked by the potential barrier of the p-type semiconductor region 130 and not transferred to the APD 22 side, and are accumulated in the n-type semiconductor region 132.

When the voltage VL at which the signal electrons accumulated in the PD 24 start to be transferred to the APD 22 is the voltage VL3, the signal accumulation operation period is exactly a period in which the voltage VL becomes equal to or lower than the voltage VL3. Although the voltage VL3 varies depending on the configurations of the APD 22 and the PD 24, the voltage VL3 is, e.g., about 1 V higher than the breakdown voltage Vbd of the APD 22, e.g., about −28 V.

The period in which the voltage VL is set to the voltage VL2 is a signal readout operation period in which a signal based on the signal electrons accumulated in the PD 24 is read out. When the voltage VL decreases from the voltage VL1 to the voltage VL2, the potential barrier between the PD 24 and the APD 22 decreases, and the signal electrons accumulated in the PD 24 are transferred to the APD 22. At this time, the reverse bias voltage applied to the APD 24 is 33 V which exceeds the breakdown voltage Vbd, and in the APD 24, avalanche multiplication occurs using the signal electrons transferred from the PD 24, and the photon detection pulse signal is output from the waveform shaping circuit 34.

In the driving method of the present embodiment, one frame period is divided into a plurality of unit periods, and the signal accumulation operation and the signal readout operation are performed in each of the plurality of unit periods. The length of the signal readout operation period is not particularly limited, but may be set to, for example, 1/100 or less of the length of the signal accumulation operation period. Since the signal readout operation period in each unit period is sufficiently shorter than the signal accumulation operation period, the length of the signal accumulation operation period is substantially the same the length of the unit period.

The number of divisions of one frame period is preferably appropriately set according to the length of the signal accumulation operation period so that at most one photon is incident at least at a low illuminance. For example, if a situation in which about 100 photons are incident in one frame period is the main capturing condition, one frame period is divided into, for example, 1024. When one frame period is, e.g., 1/60 seconds, i.e., 16.7 ms, the signal accumulation operation period may be set to 16.3 µs, and the signal readout operation period may be set to 16 ns. The lengths of the signal accumulation operation period and the signal readout operation period may be set differently depending on the capturing conditions.

FIG. 9A to FIG. 9C illustrate an operation example in two consecutive periods among a plurality of periods obtained by dividing one frame period. In FIG. 9A to FIG. 9C, time t0 to time t2 is a first unit period among the plurality of periods, or the divided frame period, and time t2 to time t7 is a second unit period subsequent to the first unit period. The time t0 to the time t1 is a signal accumulation operation period of the first unit period, and the time t1 to the time t2 is a signal readout operation period of the first unit period. Further, the time t2 to the time t4 is a signal accumulation operation period in the second unit period, and the time t4 to the time t7 is a signal readout operation period in the second unit period. In FIG. 9A to FIG. 9C, it is assumed that no photons are incident during the first unit period, and one photon is incident at time t3 during the signal accumulation operation period of the second unit period.

During the first unit period from the time t0 to the time t1, no photons are incident on the photoelectric conversion unit 20. Therefore, during the signal accumulation operation period of the first unit period, no signal electrons are accumulated in the PD 24.

When the voltage VL is switched from the voltage VL1 to the voltage VL2 at the time t1, a transition is made to the signal readout operation period of the first unit period. By switching the voltage VL from the voltage VL1 to the voltage VL2, the potential barrier between the PD 24 and the APD 22 decreases, but the potential of the node-A does not largely change because no signal electrons are accumulated in the PD 24. However, when the voltage VL changes from the voltage VL1 to the voltage VL2, the potential of the node-A is slightly lowered by coupling through a junction capacitance between the cathode and the anode of the APD 22. At this time, the transition time of the voltage VL from the voltage VL1 to the voltage VL2, the resistance value of the quenching element 32, the binarization threshold value of the waveform shaping circuit 34, and the like are set so that the potential of the node-A does not fall below the binarization threshold value of the waveform shaping circuit 34.

Switching of the voltage VL in the signal readout operation period is performed by changing the voltage VL in a pulse form. In other words, the voltage transition from the voltage VL1 to the voltage VL2 and the voltage transition from the voltage VL2 to the voltage VL1 are performed by changing the voltage VL in a rectangular shape. The transition time required for switching between the voltage VL1 and the voltage VL2 is desirably set to 100 ns or less.

At the subsequent time t2, the voltage VL is switched from the voltage VL2 to the voltage VL1, whereby the transition is made to the signal accumulation operation period of the second unit period. Assuming that one photon is incident on the photoelectric conversion unit 20 at time t3 during the signal accumulation operation period, one signal electron generated by the photoelectric conversion in the PD 24 is accumulated in the n-type semiconductor region 132 constituting the cathode of the PD 24.

At the subsequent time t4, the voltage VL is switched from the voltage VL1 to the voltage VL2, whereby the period is shifted to the signal readout operation period of the second unit period. By switching the voltage VL from the voltage VL1 to the voltage VL2, the potential barrier between the PD 24 and the APD 22 decreases, and the signal electron accumulated in the PD 24 is transferred to the APD 24. At this time, a reverse bias voltage exceeding the breakdown voltage Vbd is applied to the APD 22, and avalanche multiplication is generated by the signal electron transferred from the PD 24, and an avalanche current flows through the APD 22. When the avalanche current flows through the quenching element 32, a voltage drop by the quenching element 32 occurs, and the voltage of the node-A begins to drop. When the voltage drop amount of the node-A increases and the avalanche multiplication stops, the voltage level of the node-A does not drop any further.

When the avalanche multiplication in the APD 22 stops, a current that compensates for the voltage drop flows from the node to which the voltage VH is supplied to the node-A via the quenching element 32, and the voltage of the node-A gradually increases and is settled to the initial voltage level.

The waveform shaping circuit 34 binarizes the signal input from the node-A according to a predetermined binarization threshold value, and outputs the binarized signal from the node-B. Specifically, the waveform shaping circuit 34 outputs a low-level signal from the node-B when the voltage level of the node-A exceeds the determination threshold value, and outputs a high-level signal from the node-B when the voltage level of the node-A is equal to or lower than the binarization threshold value. For example, as illustrated in FIG. 9B, it is assumed that the voltage of the node-A is equal to or lower than the binarization threshold value during a period from the time t5 to the time t6. In this case, as illustrated in FIG. 9C, the signal level at the node-B becomes high-level during the period from the time t5 to the time t6.

The number of photon detection pulses output from the waveform shaping circuit 34 counted at the counter circuit 36 in the subsequent stage in the plurality of signal readout operation periods in one frame period is the digital signal corresponding to the number of photons incident during the one frame period.

Figure 10:
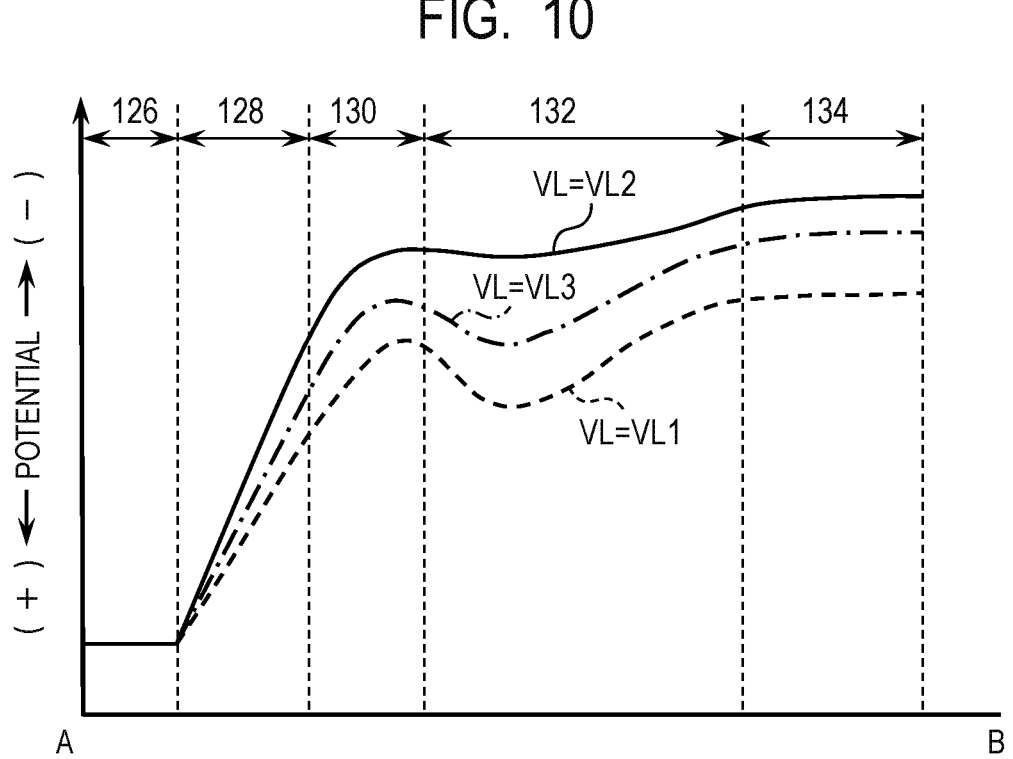
FIG. 10 is a graph illustrating a potential distribution in the photoelectric conversion unit in the photoelectric conversion device according to the first embodiment.

FIG. 10 is a graph illustrating a potential distribution in the semiconductor layer 120 along the line A-B in FIG. 7.

In FIG. 10, the vertical axis represents a potential energy with respect to electrons. That is, the higher the vertical axis, the lower the potential, and the lower the vertical axis, the higher the potential. In FIG. 10, a broken line indicates a potential distribution when the voltage VL is the voltage VL1 (in the signal accumulation operation), a one-dot-chain line indicates a potential distribution when the voltage VL is the voltage VL3, and a solid line indicates a potential distribution when the voltage VL is the voltage VL2 (in the signal readout operation). It is assumed that, when the voltage VL is the voltage VL3, the avalanche occurrence probability of electrons in the APD 22 is sufficiently high, for example, 80%. Normally, the reverse bias voltage of the APD 22 for developing such a high avalanche occurrence probability is a value obtained by adding 1.0 V or more to the breakdown voltage Vbd.

As described above, at least at a low illuminance, the length of the signal accumulation operation period is set so that at most one signal electron is accumulated in the n-type semiconductor region 132 constituting the signal accumulation portion of the PD 24. The signal electron read out by controlling the potential of the anode (p-type semiconductor region 130) does not need to be distinguished from other signal electrons, the control of the anode potential during the signal readout operation may be, for example, a rectangular shape as illustrated in FIG. 9A.

Therefore, according to the driving method of the present embodiment, the signal readout operation period may be shortened, and the possibility of counting the dark electrons generated in the signal readout operation period may be extremely low.

Note that although a rectangular readout pulse is used, actually, there is a constant transition time of rising and falling a pulse, but this transition time is usually about several ns and at most about 100 ns. Even in consideration of the plurality of signal readout operations during one frame period, the signal readout operation period of the present embodiment is sufficiently short as compared with a case where a time of several hundreds of μs to 1 ms is required to control a slope-shaped readout voltage when the plurality of signal electrons are sequentially read out.

In the signal accumulation operation, as indicated by the broken line in FIG. 10, a potential barrier is formed at a position corresponding to the p-type semiconductor region 130 between the cathode of the APD 22 (n-type semiconductor regions 126 and 128) and the cathode of the PD 24 (n-type semiconductor region 132). The potential barrier has a height sufficient to prevent the electrons accumulated in the signal accumulation portion of the PD 24 (n-type semiconductor region 132) from getting thereover and being transferred to the cathode of the APD 22 under a bias condition during the signal accumulation operation.

When the voltage VL decreases from the voltage VL1 to the voltage VL3, the potential barrier with respect to the electrons accumulated in the signal accumulation portion of the PD 24 decreases as indicated by the one-dot-chain line in FIG. 10.

However, the potential barrier has such a height that the probability that electrons accumulated in the signal accumulation portion of the PD 24 are transferred to the cathode of the APD 22 is sufficiently reduced. The sufficiently small probability mentioned here is, for example, about 4% to 5% or less.

The impurity density of the p-type semiconductor region 130 is set such that the potential barrier formed between the cathode of the APD 22 and the cathode of the PD 24 has the above-described characteristics. The determination threshold value of the waveform shaping circuit 34 is set so as to be able to detect the avalanche multiplication phenomenon generated in the APD 22 when the voltage VL is equal to or lower than the voltage VL3.

When the voltage VL further decreases to the voltage VL2, as indicated by the solid line in FIG. 10, the potential barrier to the electrons accumulated in the signal accumulation portion of the PD 24 almost disappears. The avalanche occurrence probability of electrons in the APD 22 exceeds 90%.

In this way, the electrons accumulated in the signal accumulation portion of the PD 24 are substantially reliably transferred to the APD 22 in a process in which the voltage VL reaches the voltage VL2 from the voltage VL1, or in a state in which the voltage VL reaches the voltage VL2. When the voltage VL is in the state of the voltage VL2, the avalanche occurrence probability exceeds 90%, and the probability that the electrons accumulated in the signal accumulation portion are detected as a signal is high.

In a general SPAD driving method without a signal accumulation operation (for example, the driving method described with reference to FIG. 5A to FIG. 5C), a voltage (VH−VL) is normally set to about (Vbd+2V), and the avalanche occurrence probability is about 90%. Therefore, the driving method of the present embodiment has little decrease in sensitivity and saturation signal amount as compared with conventional general driving.

It is to be noted that although it has been described that the conditions for forming the p-type semiconductor region are set such that the transfer probability of the electrons accumulated in the signal accumulation portion is sufficiently reduced until the potential distribution along the line A-B reaches the transient state indicated by the one-dot-chain line in FIG. 10, the transfer probability is not determined by only the potential barrier. That is, the transfer probability of the electrons also depends on a length of a period in a state of a certain potential barrier. The longer the period in the state of the certain potential barrier, the higher the probability that the electrons are transferred beyond the potential barrier.

In the driving method of the present embodiment, the falling transition time of the signal readout pulse is set to be extremely short, and the time required for the potential distribution to reach the state of the one-dot-chain line from the state of the broken line in FIG. 10 is extremely short, which greatly contributes to suppressing the electron transfer probability in this period. When the voltage VL becomes the voltage VL2 and the potential distribution indicated by the solid line in FIG. 10 is formed, the electrons accumulated in the charge accumulation portion are transferred to the APD 22 for an extremely short time, for example, 1 ns. More precisely, in the state of the potential distribution indicated by the solid line in FIG. 10, the probability that the electrons accumulated in the signal accumulation portion are read out to the APD 22 during the period of 1 ns to several ns is almost 100%. Therefore, in the state of the potential distribution indicated by the solid line in FIG. 10, it is sufficient that the length of the period during which the voltage VL is the voltage VL2 is about 10 ns.

As a result, it is important that the transfer of the signal electrons from the PD 24 to the APD 22 is performed in a small voltage range of about 2 V, which is a difference between the voltage VL3 and the voltage VL2, and in a range having a high avalanche probability. If the readout control voltage applied to the APD 22 has a slope shape over a long period of time, the signal electrons start to be transferred in a state where the avalanche generation probability is low before the voltage VL reaches the voltage VL3. Therefore, the detection probability of the signal amount decreases, and the sensitivity decreases. Alternatively, the reverse bias voltage applied to the APD 22 is increased by further lowering the potential of the voltage VL2 with introducing a structure in which charge transfer is prevented in a situation where the avalanche occurrence probability is low. In this case, however, the reverse bias voltage of the APD 22 is increased, i.e., the voltage added to the breakdown voltage Vbd is increased, which may cause a problem of reliability deterioration.

In the present embodiment, the length of the signal accumulation operation period is set such that at most one signal electron is accumulated in the PD 24 during the signal accumulation operation period under at least a low illuminance. Therefore, a signal drawing phenomenon basically does not occur during the signal readout operation period. Further, a rectangular pulse with a short time width may be applied as the readout control voltage, and generation of avalanche multiplication due to dark electrons may be reduced. Further, the signal readout operation may be performed within the range of the reverse bias voltage of the APD 22 in which the avalanche occurrence probability is sufficiently high but the reliability is not reduced.

Therefore, according to the present embodiment, it is possible to realize the SPAD sensor in which the dark output due to dark electrons is largely reduced and the S/N ratio at low illuminance is largely improved without lowering the sensitivity, the saturation signal amount, and the reliability as compared with the conventional general SPAD.

Figure 11:
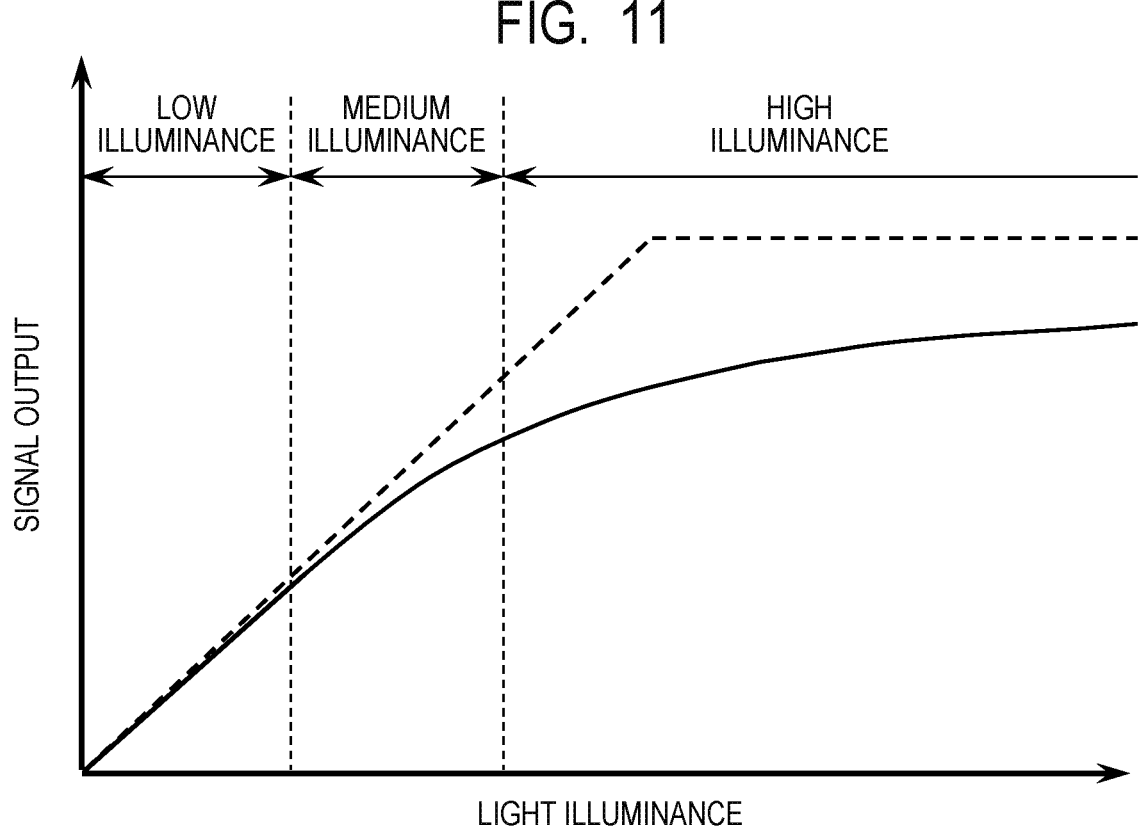
FIG. 11 is a graph illustrating a photoelectric conversion characteristics of the pixel of the photoelectric conversion device.

Next, the performance of the image sensor including the condition of high illuminance during imaging will be described with reference to FIG. 11. FIG. 11 is a graph illustrating photoelectric conversion characteristics of pixels of the photoelectric conversion device. A solid line indicates characteristics of a pixel of the photoelectric conversion device according to the present embodiment, and a broken line indicates characteristics of a conventional general SPAD pixel.

The saturation signal amount of a conventional general SPAD pixel is determined by an upper limit count value of a counter that counts the number of times avalanche multiplication is detected in APD. The signal output up to the upper limit count value basically linearly increases with an increase in light illuminance.

On the other hand, the signal output of the pixel 12 of the present embodiment linearly increases with respect to the increase of the light illuminance in the low illuminance range as in the conventional SPAD, but decreases in the medium to high illuminance range as compared with the conventional SPAD. This is because, as the light illuminance increases, the possibility that a plurality of signal electrons is accumulated in one signal accumulation operation period increases. When the plurality of signal electrons is accumulated in one signal accumulation operation period, the plurality of signal electrons may be transferred almost simultaneously due to the fact that the readout control signal is a rectangular pulse and the influence of the signal drawing phenomenon. Therefore, even if, e.g., ten signal electrons are accumulated in one signal accumulation operation period, only, e.g., three avalanche multiplications may be detected.

Since the SPAD sensor has little readout noise as compared with a CMOS sensor, the SPAD sensor is mainly used for photographing at a low illuminance by utilizing the fact that the S/N ratio at a low illuminance is high. However, the conventional general SPAD sensor has a larger amount of dark output noise and white flaw due to a dark current than the CMOS sensor, and the advantage of the high S/N ratio at low illuminance decreases depending on conditions such as high temperature. In this respect, in the photoelectric conversion device according to the present embodiment, the influence of the noise due to the dark current may be largely suppressed, and the advantage of the high S/N ratio at low illuminance is less likely to be influenced by the photographing condition. Although the signal output is certainly lowered at medium to high illuminance as described above, if the photoelectric conversion characteristics are grasped in advance, it is possible to calculate the original signal output, i.e., the signal output when the photoelectric conversion characteristics are linear, from the output signal obtained by the sensor. In the photoelectric conversion device according to the present embodiment, as illustrated in FIG. 11, the signal output increases with the increase of the light illuminance even when the illuminance reaches a considerable high illuminance, and it may be said that the illuminance range in which the original signal output is obtained by arithmetic processing is wide, and one aspect of the characteristic of high dynamic range is provided.

As described above, according to the present embodiment, it is possible to realize the photoelectric conversion device capable of greatly reducing the dark output due to dark electrons without lowering the sensitivity, the saturation signal amount, and the reliability, and having high dynamic range characteristics.

Second Embodiment

Figure 12:
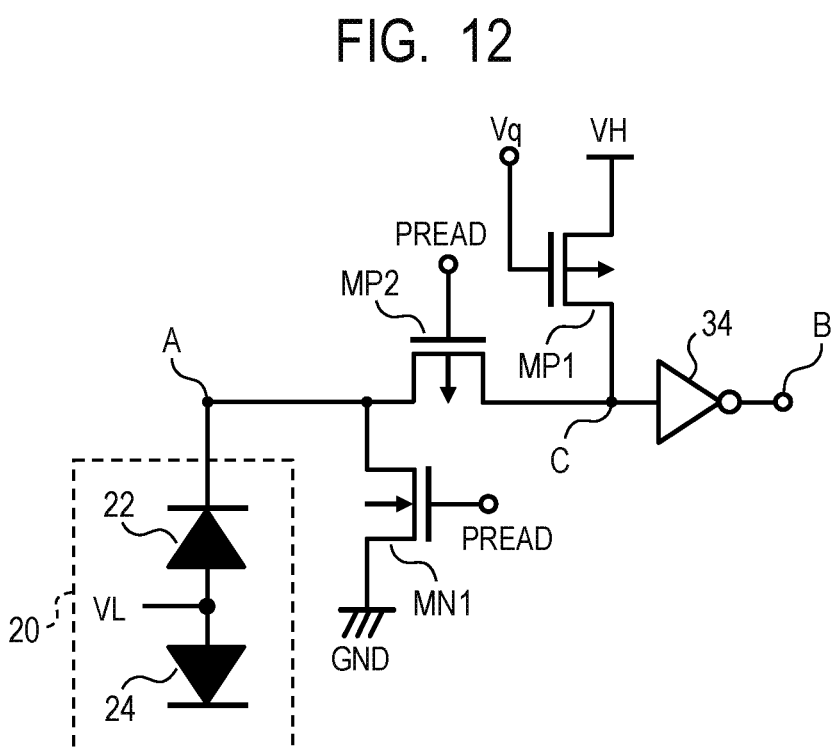
FIG. 12 is an equivalent circuit diagram of a main part of a pixel in a photoelectric conversion device according to a second embodiment.
Figures 13A, 13B, 13C, 13D:
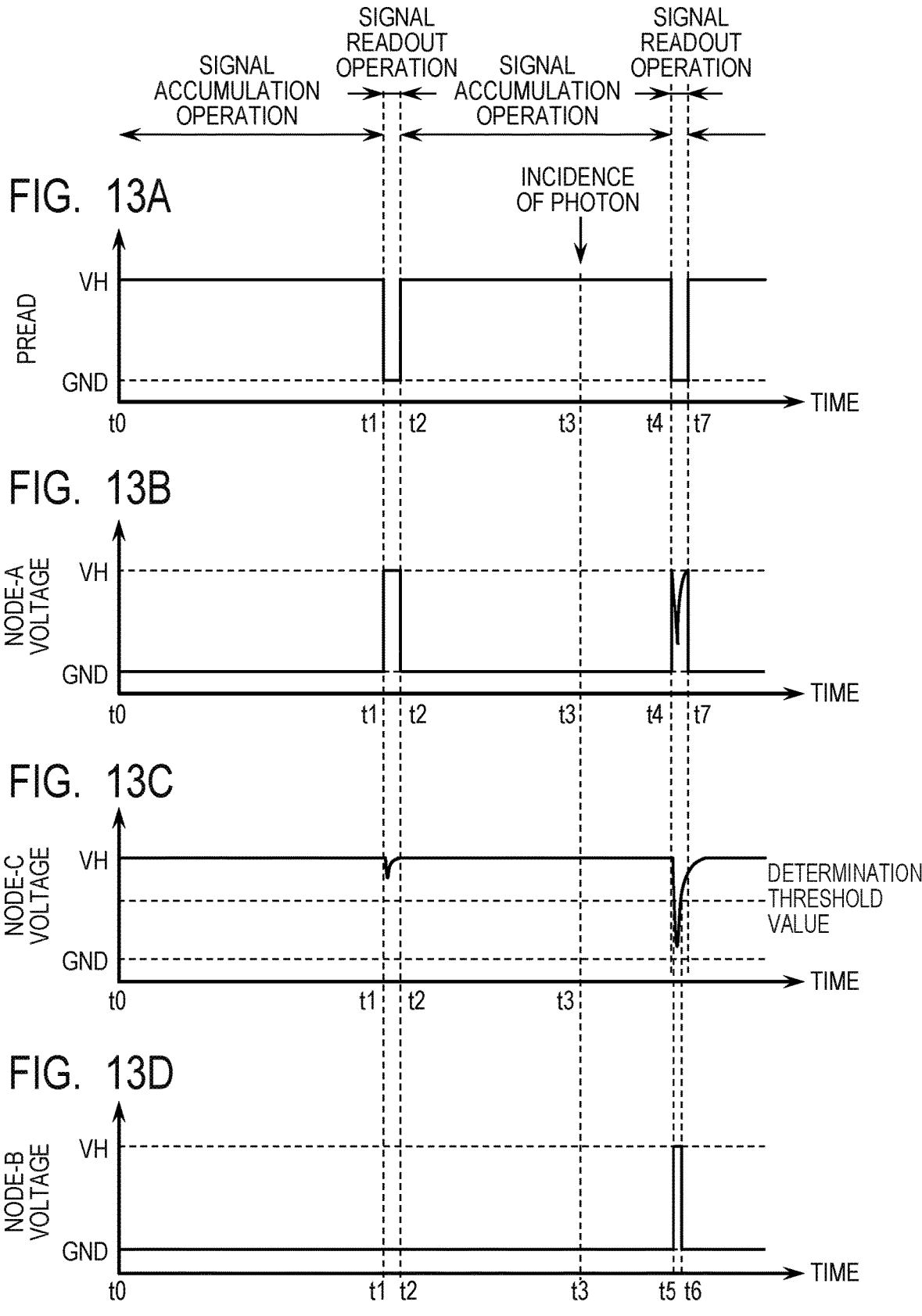
FIG. 13A, FIG. 13B, FIG. 13C, and FIG. 13D are timing charts illustrating a method of driving the photoelectric conversion device according to the second embodiment.

A photoelectric conversion device according to a second embodiment will be described with reference to FIG. 12 to FIG. 13D. FIG. 12 is a circuit diagram illustrating a configuration example of a pixel of the photoelectric conversion device according to the present embodiment. FIG. 13A to FIG. 13D are timing charts illustrating a method of driving the photoelectric conversion device according to the present embodiment. Components similar to those of the photoelectric conversion device according to the first embodiment are denoted by the same reference numerals, and description thereof will be omitted or simplified.

The photoelectric conversion device according to the present embodiment is different from the first embodiment in which the operation is controlled by changing the anode potential, and the photoelectric conversion device is configured to control the operation by changing the cathode potential. The photoelectric conversion device according to the present embodiment is basically the same as the photoelectric conversion device according to the first embodiment except for the circuit configuration of the pixel 12. In the present embodiment, differences of the pixel 12 will be mainly described, and a description of portions similar to those of the first embodiment will be appropriately omitted.

As illustrated in FIG. 12, the pixel 12 of the photoelectric conversion device according to the present embodiment is different from the pixel 12 of the photoelectric conversion device according to the first embodiment illustrated in FIG. 8 in the configuration of the stage preceding the node-B.

That is, the pixel 12 of the photoelectric conversion device according to the present embodiment includes an APD 22, a PD 24, p-channel MOS transistors MP1 and MP2, and the n-channel MOS transistor MN1 in the preceding stage of the node-B. The configuration subsequent to the node-B may be similar to, for example, the configuration of the pixel 12 of the first embodiment illustrated in FIG. 3.

The configuration of the photoelectric conversion unit 20 is similar to that of the first embodiment. The node-A, which is the output node of the photoelectric conversion unit 20, is connected to the drain of the n-channel MOS transistor MN1 and the drain of the p-channel MOS transistor MP2. The drain of the p-channel MOS transistor MP1 and the source of the p-channel MOS transistor MP2 are connected to the input node of the waveform shaping circuit 34. Hereinafter, the connection node of the drain of the p-channel MOS transistor MP1, the source of the p-channel MOS transistor MP2, and the input node of the waveform shaping circuit 34 is referred to as the node-C. The source of the n-channel MOS transistor MN1 is connected to a ground voltage node. The source of the p-channel MOS transistor MP1 is connected to the node to which the voltage VH is supplied. The predetermined voltage Vq is supplied to the gate of the p-channel MOS transistor MP1. The control signal PREAD is supplied to the gate of the n-channel MOS transistor MN1 and the gate of the p-channel MOS transistor MP2.

The p-channel MOS transistor MP1 is the MOS transistor functioning as the quenching element 32. The p-channel MOS transistor MP1 is always in the ON state, and constitutes the passive quench circuit. The p-channel MOS transistor MP2 is the MOS transistor for controlling the electrical connection between the node-A and the node-C. The n-channel MOS transistor MN1 is the MOS transistor that controls the electrical connection between the node-A and the node shared by the predetermined fixed voltage (for example, the ground voltage node). The control signal PREAD supplied to the gates of the n-channel MOS transistor MN1 and the p-channel MOS transistor is the readout control signal for controlling the signal readout operation period, and is supplied, for example, from the vertical scanning circuit unit 40 via the control line 14.

In the pixel 12 of the present embodiment, the operation mode of the photoelectric conversion unit 20 is controlled by voltage applied to the cathode of the APD 22. The other conditions are similar to those of the first embodiment. The value of the reverse bias voltage applied to the APD 22 and the element operation are basically the same as those of the first embodiment. However, in the present embodiment, positive potential pulse is used as the readout control signal instead of the negative potential pulse used in the first embodiment. In this respect, the pixel 12 of the present embodiment is suitable for actual application.

Next, a method of driving the photoelectric conversion device according to the present embodiment will be described with reference to FIG. 12 to FIG. 13D. FIG. 13A to FIG. 13D are timing diagrams illustrating basic operation of the pixel in the photoelectric conversion device according to the present embodiment. FIG. 13A illustrates a waveform of the control signal PREAD, and FIG. 13B illustrates a waveform of a voltage at the output node of the photoelectric conversion unit 20 (node-A). FIG. 13C illustrates a waveform of a voltage at the input node of the waveform shaping circuit 34 (node-C), and FIG. 13D illustrates a waveform of a voltage at the output node of the waveform shaping circuit 34 (node-B).

In the driving method of the present embodiment, as described above, the operation mode of the photoelectric conversion unit 20 is controlled by the voltage applied to the cathode of the APD 22. For example, as in the first embodiment, when the breakdown voltage Vbd of the APD 22 is 30 V and the voltage VL is −29 V, the voltage applied to the cathode of the APD 22 may be controlled to the ground voltage (GND=0 V) or the voltage VH (for example, 4 V). The ground voltage GND is the voltage at which a potential difference from the voltage VL becomes less than the breakdown voltage Vbd, and the voltage VH is the voltage at which the potential difference from the voltage VL becomes greater than the breakdown voltage Vbd. That is, the period in which the voltage applied to the cathode of the APD 22 is set to the ground voltage GND is the signal accumulation operation period, and the period in which the voltage applied to the cathode of the APD 22 is set to the voltage VH is the signal readout operation period.

Also in the driving method of the present embodiment, as in the first embodiment, one frame period is divided into a plurality of periods, and the signal accumulation operation and the signal readout operation are performed in each one of the plurality of divided periods, or unit periods. The number of divisions in one frame period is the same as in the first embodiment. That is, at least at low illuminance, the length of each signal accumulation operation period is set so that at most only one photon is basically incident.

FIG. 13A to FIG. 13D illustrate an operation example in two consecutive periods among the plurality of the divided periods. In FIG. 13A to FIG. 13D, time t0 to time t2 is the first unit period among the plurality of unit periods, and time t2 to time t7 is the second unit period subsequent to the first unit period. The time t0 to time t1 is the signal accumulation operation period of the first unit period, and the time t1 to the time t2 is the signal readout operation period of the first unit period. Further, the time t2 to time t4 is the signal accumulation operation period of the second unit period, and the time t4 to the time t7 is the signal readout operation period of the second unit period. In FIG. 13A to FIG. 13D, it is assumed that no photon is incident during the first unit period, and one photon is incident during the signal accumulation operation period of the second unit period.

In the signal accumulation operation period of the first unit period from the time t0 to the time t1, the control signal PREAD is controlled to the voltage VH (high-level). Thus, the n-channel MOS transistor MN1 is turned on, and the node-A is connected to the ground voltage node via the n-channel MOS transistor MN1. A reverse bias voltage lower than the breakdown voltage Vbd is applied to the APD 22. Here, it is assumed that no photons are incident on the photoelectric conversion unit 20 during the signal accumulation operation period of the first unit period, and therefore no signal electrons are accumulated in the PD 24 during this period.

When the control signal PREAD is controlled to the voltage VH, the p-channel MOS transistor MP2 is turned off (non-conductive state), and the node-A is disconnected from the node-C. Thus, the potential change of the node-A is not transmitted to the node-C.

At the time t1, the control signal PREAD is controlled from the voltage VH (high-level) to the ground voltage GND (low-level) to shift to the signal readout operation period in the first unit period. That is, by controlling the control signal PREAD to the ground voltage GND, the n-channel MOS transistor MN1 is turned off and the p-channel MOS transistor MP2 is turned on (conductive state). The voltage VH is applied to the node-A via the p-channel MOS transistors MP1 and MP2. As a result, a reverse bias voltage higher than the breakdown voltage Vbd is applied to the APD 22, and the APD 22 is in a state capable of avalanche multiplication.

Since no signal electrons are accumulated in the PD 24 during the signal accumulation operation period of the first unit period, no signal electrons are transferred from the PD 24 to the APD 22 during the signal readout operation period of the first unit period, and the potential of the node-C does not largely change. However, the potential of the node-C is instantaneously lowered by the charge-up current for raising the potential of the node-A. The on-resistances of the p-channel MOS transistors MP1 and MP2 and the binarization threshold value of the waveform shaping circuit 34 are set so that the potential of the node-C at this time does not fall below the binarization threshold value of the waveform shaping circuit 34.

At the subsequent time t2, the control signal PREAD is controlled from the ground voltage GND (low-level) to the voltage VH (high-level) to shift to the signal accumulation operation period of the second unit period. Thus, the n-channel MOS transistor MN1 is turned on, and the node-A is connected to the ground voltage node via the n-channel MOS transistor MN1. The reverse bias voltage of the APD 22 becomes lower than the breakdown voltage Vbd, and the signal accumulation operation in the PD 24 is performed. Assuming that one photon is incident on the photoelectric conversion unit 20 at time t3 during the signal accumulation operation period, one signal electron generated by the photoelectric conversion in the PD 24 is accumulated in the n-type semiconductor region 132 constituting the cathode of the PD 24. When the control signal PREAD is controlled to the voltage VH, the p-channel MOS transistor MP2 is turned off, and the output node of the photoelectric conversion unit 20 is disconnected from the node-C. Thereby, the voltage of the node-C is kept at the voltage VH, and the state of the waveform shaping circuit 34 does not change.

At the subsequent time t4, the control signal PREAD is controlled from the voltage VH (high-level) to the ground voltage GND (low-level) to shift to the signal readout operation period in the second unit period. As a result, the voltage of the node-A increases to the voltage VH, and the reverse bias voltage higher than the breakdown voltage Vbd is applied to the APD 22, and the APD 22 is in a state capable of avalanche multiplication. At this time, the signal electron accumulated in the PD 24 is transferred to the APD 22, and causes avalanche multiplication in the APD 22.

The avalanche current flows through the APD 22 from the node to which the voltage VH is supplied through the series connection of the p-channel MOS transistor MP1 and the p-channel MOS transistor MP2. The on-resistance of the p-channel MOS transistor MP2 and the binarization threshold value of the waveform shaping circuit 34 are set so that the potential change of the node-A at this time may be sufficiently transmitted to the node-C and the avalanche multiplication phenomenon may be detected by the waveform shaping circuit 34.

When the avalanche current flows through the p-channel MOS transistor MP1 serving as the quenching element 32, a voltage drop occurs, and the voltages of the node-A and node-C start to drop from the voltage VH.

When the voltage drop amount of the node-A increases and the avalanche multiplication stops, the voltage levels of the node-A and node-C no longer drop. When the avalanche multiplication in the APD 22 stops, the current that compensates for the voltage drop flows from the voltage VH node to the node-A, and the voltages of the node-A and node-C gradually increase.

The waveform shaping circuit 34 binarizes the signal input from the node-C according to the predetermined binarization threshold value, and outputs the signal from the node-B. Specifically, the waveform shaping circuit 34 outputs the low-level signal from the node-B when the voltage level of the node-A exceeds the binarization threshold value, and outputs a high-level signal from the node-B when the voltage level of the node-A is equal to or lower than the binarization threshold value. For example, as illustrated in FIG. 13C, it is assumed that the voltage of the node-C is lower than the binarization threshold value during a period from time t5 to time t6. In this case, as illustrated in FIG. 13D, the signal level at the node-B becomes high-level (voltage VH) during the period from the time t5 to the time t6. This output pulse rising from the time t5 to the time t6 is a photon detection pulse indicating that a photon is incident during the signal accumulation operation period.

By counting the number of photon detection pulses output from the waveform shaping circuit 34 by the counter circuit 36 in the subsequent stage in the plurality of signal readout operation periods in the one frame period, the signal corresponding to the number of photons incident during the one frame period may be obtained.

In order to perform the readout operation in which the cathode potential of the APD 22 is changed in a slope shape to detect the avalanche multiplication during the potential change, the cathode potential during the potential change must be guided to the waveform shaping circuit 34. However, in this case, the through current flows at the inverter circuit constituting the waveform shaping circuit 34 in most of the relatively long signal readout operation period, and power consumption increases. In this respect, the current required for the operation control in the driving method of the present embodiment is only small current for charging/discharging the node-A at the start and end of the readout operation, and power consumption may be greatly reduced as compared with the case where the cathode potential is changed in a slope shape.

As described above, according to the present embodiment, even when the cathode potential of the APD 22 is controlled, substantially the same operation as that of the first embodiment may be performed. Therefore, it is possible to realize the SPAD sensor in which the dark output due to dark electrons is largely reduced and the S/N ratio at a low illuminance is largely improved without lowering the sensitivity, the saturation signal amount, and the reliability as compared with the conventional general SPAD. Since the operation of the pixel 12 may be controlled by the positive potential pulse, the photoelectric conversion device may be realized with the circuit configuration more available for actual devices.

Third Embodiment

Figure 14:
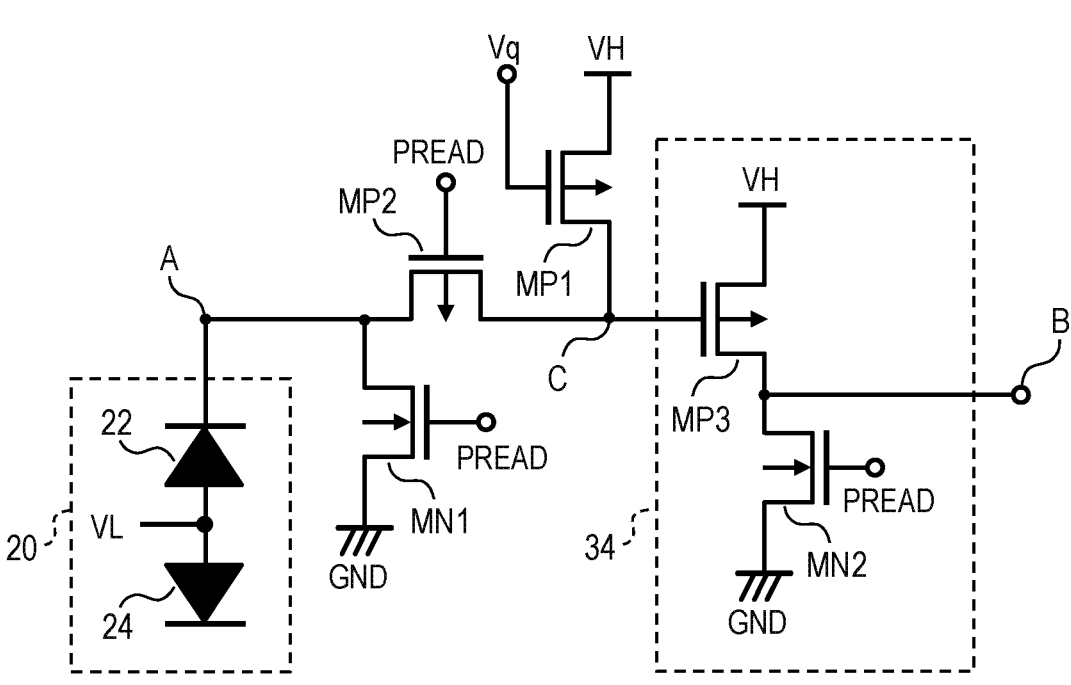
FIG. 14 is an equivalent circuit diagram of a main part of a pixel in a photoelectric conversion device according to a third embodiment.
Figures 15A, 15B, 15C, 15D:
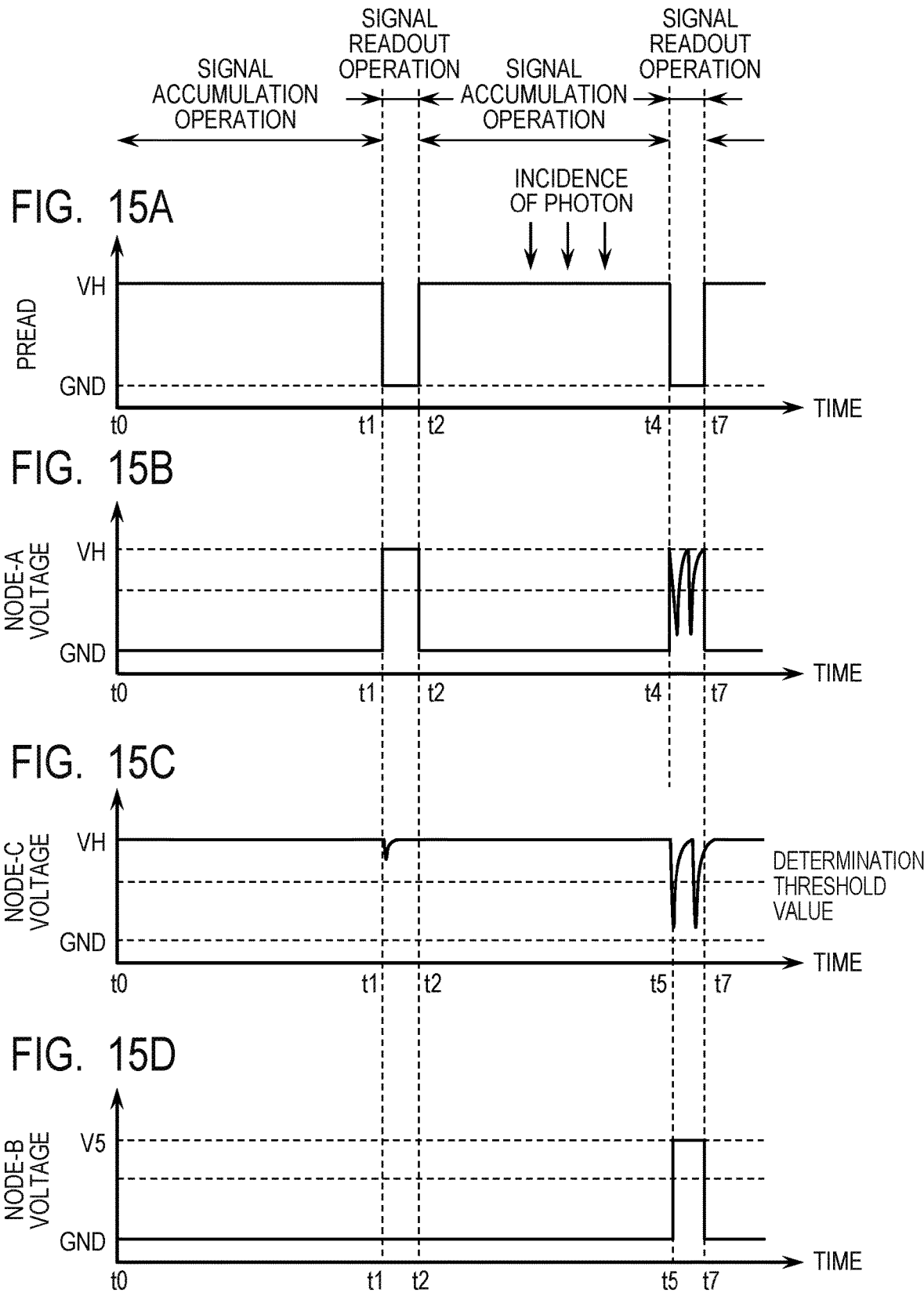
FIG. 15A, FIG. 15B, FIG. 15C, and FIG. 15D are timing charts illustrating a method of driving the photoelectric conversion device according to the third embodiment.

A photoelectric conversion device according to a third embodiment will be described with reference to FIG. 14 to FIG. 15D. FIG. 14 is the circuit diagram illustrating the configuration example of the pixel of the photoelectric conversion device according to the present embodiment. FIG. 15A to FIG. 15D are timing charts illustrating a method of driving the photoelectric conversion device according to the present embodiment. Components similar to those of the photoelectric conversion device according to the first or second embodiment are denoted by the same reference numerals, and description thereof will be omitted or simplified.

The photoelectric conversion device according to the present embodiment is basically the same as the photoelectric conversion device according to the first or second embodiment except that the configuration of the pixel 12 is different. In the present embodiment, differences of the pixel 12 of the present embodiment from the pixel 12 of the first or second embodiment will be mainly described, and a description of portions similar to those of the first or second embodiment will be appropriately omitted.

The pixel 12 of the photoelectric conversion device according to the present embodiment differs from the pixel 12 of the photoelectric conversion device according to the second embodiment illustrated in FIG. 12 in that the waveform shaping circuit 34 is configured using a p-channel MOS transistor MP3 and an n-channel MOS transistor MN2 as illustrated in FIG. 14. The other points of the pixel 12 of the present embodiment are the same as those of the pixel 12 of the second embodiment.

The gate of the p-channel MOS transistor MP3 is connected to the node-C, which is also the input node of the waveform shaping circuit 34. The source of the p-channel MOS transistor MP3 is connected to the voltage VH node. The drain of the p-channel MOS transistor MP3 is connected to the drain of the n-channel MOS transistor MN2. The connection node between the drain of the p-channel MOS transistor MP3 and the drain of the n-channel MOS transistor MN2 is the output node of the waveform shaping circuit 34 (node-B). The source of the n-channel MOS transistor is connected to the ground voltage node. The same control signal PREAD as the control signal supplied to the n-channel MOS transistor MN1 and the p-channel MOS transistor MP2 is supplied to the gate of the n-channel MOS transistor MN2.

The pixel 12 of the present embodiment takes into account imaging conditions of medium to high illuminance, i.e., a case where a plurality of signal electrons is accumulated in the PD 24 during one signal accumulation operation period. When two or more signal electrons are accumulated in the PD 24, the number of times of avalanche multiplication which may be detected in the signal readout operation is smaller than the number of signal electrons, but if the number of times of detection of avalanche multiplication varies for each pixel, sensitivity variation occurs, and image quality deteriorates. In order to prevent this, in the pixel 12 of the present embodiment, when one or more signal electrons are accumulated in the PD 24 during one signal accumulation operation period, the waveform shaping circuit 34 detects the avalanche multiplication only once regardless of the number of accumulated signal electrons.

The simplest method for preventing the avalanche multiplication from being detected a plurality of times during one signal readout operation period is to set the pulse width of the control signal for controlling the signal readout operation period to be short. That is, since the predetermined time is required to detect one avalanche multiplication, two or more avalanche multiplications are not detected by setting the length of the signal readout operation period to be equal to or less than the predetermined time. The predetermined time period (hereinafter referred to as a dead time period) is, for example, a time period from when the potential of the node-A is lowered by the avalanche current to when the potential returns to the initial potential by the quenching element 32. For example, the output pulse width illustrated in FIG. 5C is almost dead time. However, it is necessary to satisfy the condition that almost all the signal electrons accumulated in the PD 24 are transferred to the APD 22 during the signal readout operation period.

In the pixel 12 of the present embodiment, by devising the circuit configuration of the waveform shaping circuit 34, even when one or more avalanche multiplication occurs during one signal readout operation period, the number of avalanche multiplication detection is only once. According to the circuit configuration of the pixel 12 of the present embodiment illustrated in FIG. 14, the pulse width of the control signal for controlling the signal readout operation period may be set independently of the dead time.

Next, a method of driving the photoelectric conversion device according to the present embodiment will be described with reference to FIG. 14 to FIG. 15D. FIG. 15A to FIG. 15D are timing diagrams illustrating a basic operation of the pixel in the photoelectric conversion device according to the present embodiment. FIG. 15A illustrates the waveform of the control signal PREAD, and FIG. 15B illustrates the waveform of voltage at the output node of the photoelectric conversion unit 20 (node-A). FIG. 15C illustrates the waveform of voltage at the input node of the waveform shaping circuit 34 (node-C), and FIG. 15D illustrates the waveform of voltage at the output node of the waveform shaping circuit 34 (node-B).

FIG. 15A to FIG. 15D illustrate an operation example in two consecutive periods among the plurality of periods obtained by dividing one frame period. In FIG. 15A to FIG. 15D, time t0 to time t2 is the first unit period among the plurality of the unit periods, or the division of one frame period, and time t2 to time t7 is the second unit period subsequent to the first unit period. The time t0 to time t1 is the signal accumulation operation period of the first unit period, and the time t1 to the time t2 is the signal readout operation period of the first unit period. Further, the time t2 to time t4 is the signal accumulation operation period of the second unit period, and the time t4 to the time t7 is the signal readout operation period of the second unit period. In FIG. 15A to FIG. 15D, it is assumed that no photon is incident during the first unit period, and two or more photons are incident during the signal accumulation operation period of the second unit period.

In the pixel 12 of the present embodiment, the element characteristics of the APD 22 and the PD 24, the set potential of the pixel circuit, and the operation control signal are the same as those of the second embodiment. Therefore, the voltage changes of the node-A and node-C accompanying the signal accumulation operation and the signal readout operation in the pixel 12 of the present embodiment are basically the same as those of the pixel 12 of the second embodiment except that assuming that two avalanche multiplications occur in the second unit period.

On the other hand, the voltage of the node-B becomes the ground voltage GND by turning on the n-channel MOS transistor MN2 during the signal accumulation operation period, and becomes the floating state by turning off the n-channel MOS transistor MN2 during the signal readout operation period. However, during the signal readout operation period, avalanche multiplication occurs in the APD 22, and when the potential of the node-C decreases and falls below the predetermined binarization threshold value, the p-channel MOS transistor MP3 is turned on and the potential of the node-B transitions from the ground voltage GND to the voltage VH. Here, the binarization threshold value corresponds to the potential enough to sufficiently turn on the p-channel MOS transistor MP3, specifically, a maximum value of the gate voltage necessary to flow the on current that can charge up the node-B to the voltage VH by one avalanche multiplication operation.

Once the voltage of the node-B transits to the voltage VH during the signal readout operation period, the node-B remains at the voltage VH even if the avalanche multiplication occurs again in the APD 22 during the signal readout operation period. The timing when the voltage of the node-B returns to the ground voltage GND again is the time t7 when the signal readout operation period ends and the control signal PREAD becomes high-level (voltage VH) and the n-channel MOS transistor MN2 turns on. That is, during the signal readout operation period, the node-B outputs one photon detection pulse that rises at time t5 at which the potential of the node-C becomes lower than the binarization threshold value and falls at the time t7, regardless of the number of signal electrons accumulated in the PD 24.

In the present embodiment, although the detection of the avalanche multiplication by the circuit in which the p-channel MOS transistor MP3 and the n-channel MOS transistor MN1 are combined is applied to the operation control by the cathode potential, the same detection function may be applied to the operation control by the anode potential.

As described above, according to the present embodiment, it is possible to realize the SPAD sensor in which the dark output due to dark electrons is largely reduced and the S/N ratio at low illuminance is largely improved without lowering the sensitivity, the saturation signal amount, and the reliability as compared with the conventional general SPAD. In addition, signal variation between pixels when a plurality of signal electrons is accumulated in one signal accumulation operation period may be suppressed and image quality may be improved.

Fourth Embodiment

A photodetection system according to a sixth embodiment will be described with reference to FIG. 16. FIG. 16 is a block diagram illustrating a schematic configuration of the photodetection system according to the present embodiment. In the present embodiment, a photodetection sensor to which the photoelectric conversion device 100 according to any one of the first to third embodiments is applied will be described.

The photoelectric conversion device 100 described in the first to third embodiments may be applied to various photodetection systems. Examples of applicable photodetection systems include imaging systems such as digital still cameras, digital camcorders, surveillance cameras, copying machines, facsimiles, mobile phones, on-vehicle cameras, and observation satellites, and the like. A camera module including an optical system such as a lens and an imaging device is also included in the photodetection system. FIG. 16 is a block diagram of a digital still camera as an example of these.

The photodetection system 200 illustrated in FIG. 16 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 forms an optical system for focusing light on the photoelectric conversion device 201. The photoelectric conversion device 201 is the photoelectric conversion device 100 described in any of the first to third embodiments, and converts the optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various corrections and compressions as necessary and outputs the processed image data. The photoelectric conversion device 201 may include an AD conversion unit that generates a digital signal to be processed by the signal processing unit 208. The AD conversion unit may be formed on a semiconductor layer (semiconductor substrate) in which the photoelectric conversion element of the photoelectric conversion device 201 is formed, or may be formed on a semiconductor layer different from the semiconductor layer in which the photoelectric conversion element of the photoelectric conversion device 201 is formed. The signal processing unit 208 may be formed on the same semiconductor layer as the photoelectric conversion device 201.

The photodetection system 200 further includes a memory unit 210 for temporarily storing image data, and an external interface unit (external I/F unit) 212 for communicating with an external computer or the like. Further, the photodetection system 200 includes a storage medium 214 such as a semiconductor memory for storing or reading out captured image data, and a storage medium control interface unit (storage medium control I/F unit) 216 for storing or reading out image data on or from the storage medium 214. The storage medium 214 may be built in the photodetection system 200, or may be detachable. Further, communication between the storage medium control I/F unit 216 and the storage medium 214 and communication from the external I/F unit 212 may be performed wirelessly.

Further, the photodetection system 200 includes a general control/operation unit 218 that performs various calculations and controls the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and a signal processing unit 208 that processes the signal output from the photoelectric conversion device 201. The timing generation unit 220 may be mounted on the photoelectric conversion device 201. Further, the general control/operation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform a distance measurement operation on a signal output from the photoelectric conversion device 201.

As described above, according to the present embodiment, by configuring the photodetection system using the photoelectric conversion devices according to the first to third embodiments, it is possible to realize a photodetection system capable of obtaining a higher quality image.

Fifth Embodiment

A range image sensor according to a fifth embodiment will be described with reference to FIG. 17. FIG. 17 is a block diagram illustrating a schematic configuration of the range image sensor according to the present embodiment. In the present embodiment, a range image sensor will be described as an example of a photodetection system to which the photoelectric conversion device 100 according to any one of the first to third embodiments is applied.

As illustrated in FIG. 17, the range image sensor 300 according to the present embodiment may include an optical system 302, a photoelectric conversion device 304, an image processing circuit 306, a monitor 308, and a memory 310. The range image sensor 300 receives light (modulated light or pulse light) emitted from the light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in any of the first to third embodiments, and has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion device according to any one of the first to third embodiments, it is possible to realize a range image sensor capable of acquiring a distance image including more accurate distance information in conjunction with improvement in characteristics of the pixels 12.

Sixth Embodiment

An endoscopic surgical system according to a sixth embodiment will be described with reference to FIG. 18.

Figure 18:
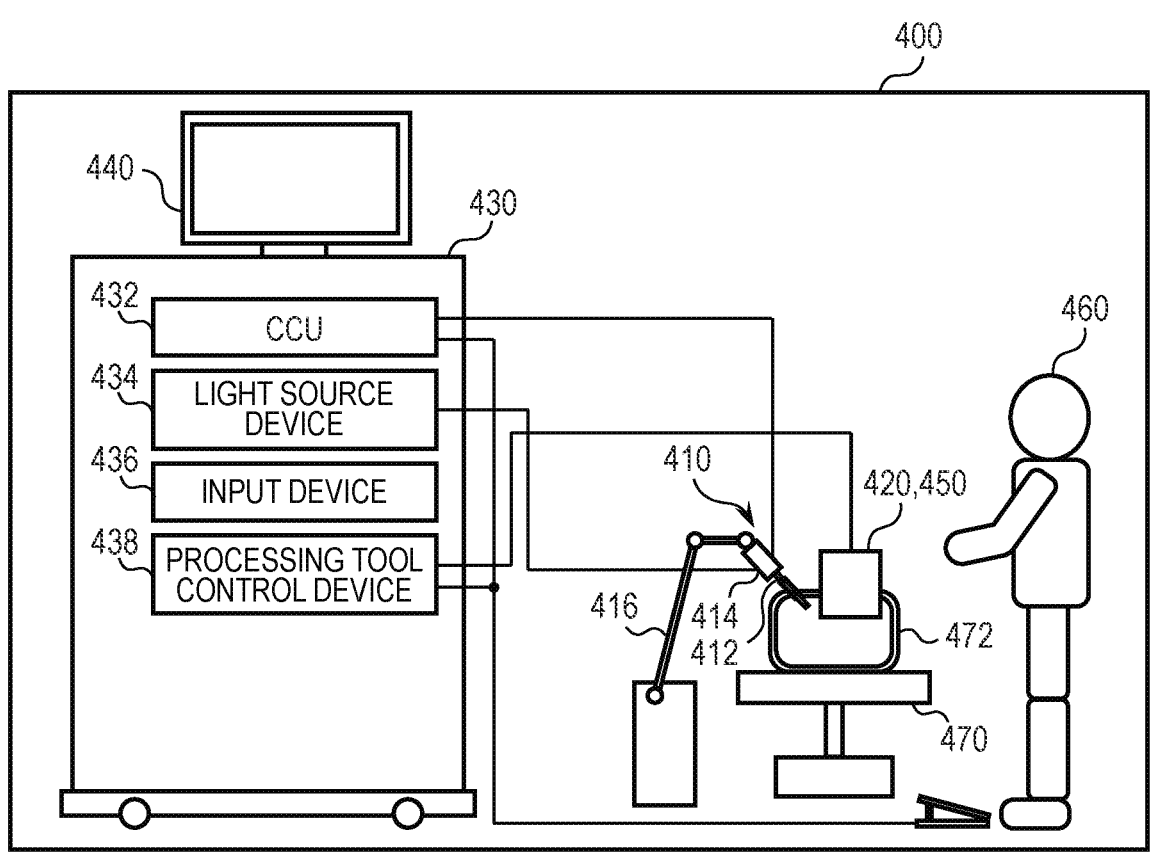
FIG. 18 is a schematic diagram illustrating a configuration example of an endoscopic surgical system according to a sixth embodiment.

FIG. 18 is a schematic diagram illustrating a configuration example of the endoscopic surgical system according to the present embodiment. In the present embodiment, an endoscopic surgical system will be described as an example of a photodetection system to which the photoelectric conversion device 100 according to any one of the first to third embodiments is applied.

FIG. 18 illustrates a state in which an operator (e.g., surgeon) 460 performs an operation on a patient 472 on a patient bed 470 using an endoscopic surgical system 400.

As illustrated in FIG. 18, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which an area of a predetermined length from the tip is inserted into the body cavity of the patient 472, and a camera head 414 connected to the base end of the lens barrel 412. Although FIG. 18 illustrates an endoscope 410 configured as a rigid mirror having a rigid lens barrel 412, the endoscope 410 may be configured as a flexible mirror having a flexible lens barrel. The endoscope 410 is held in a movable state by an arm 416.

An opening into which the objective lens is fitted is provided at the tip of the lens barrel 412. A light source device 434 is connected to the endoscope 410, and light generated by the light source device 434 is guided to the tip of the lens barrel 412 by a light guide extended inside the lens barrel 412, and is irradiated to an observation target in the body cavity of the patient 472 through an objective lens. The endoscope 410 may be a direct-viewing mirror, an oblique-viewing mirror, or a side-viewing mirror.

An optical system and a photoelectric conversion device (not illustrated) are provided inside the camera head 414, and reflected light (observation light) from the observation target is focused on the photoelectric conversion device by the optical system. The photoelectric conversion device photoelectrically converts the observation light and generates an electric signal corresponding to the observation light, i.e., an image signal corresponding to the observation image. As the photoelectric conversion device, the photoelectric conversion device 100 according to any one of the first to third embodiments may be used. The image signal is transmitted to the CCU 432 as RAW data.

The CCU 432 may be configured by a CPU (Central Processing Unit), a GPU (Graphics Processing Unit), and the like, and integrally controls the operation of the endoscope 410 and the display device 440. Further, the CCU 432 receives the image signal from the camera head 414, and performs various types of image processing for displaying an image based on the image signal, such as development processing (demosaic processing), on the image signal.

The display device 440 displays an image based on the image signal subjected to the image processing by the CCU 432 under the control of the CCU 432.

The light source device 434 may be configured by, for example, a light source such as an LED (Light Emitting Diode), and supplies irradiation light to the endoscope 410 when capturing an image of a surgical part or the like.

Input device 436 is an input interface for the endoscopic surgical system 400.

The user may input various kinds of information and instructions to the endoscopic surgical system 400 via the input device 436.

The processing tool control device 438 controls the actuation of the energy processing tool 450 for tissue ablation, incision, blood vessel sealing, etc.

The light source device 434 for supplying the irradiation light to the endoscope 410 when capturing an image of the surgical part may be formed of a white light source configured by, for example, an LED, a laser light source, or a combination thereof. When a white light source is constituted by a combination of RGB laser light sources, since the output intensity and output timing of each color (each wavelength) may be controlled with high accuracy, the white balance of the captured image may be adjusted in the light source device 434. In this case, the observation object is irradiated with the laser light from each of the RGB laser light sources in a time division manner, and the driving of the imaging element of the camera head 414 is controlled in synchronization with the irradiation timing, whereby the images corresponding to the RGB light sources may be captured in a time division manner. According to this method, a color image may be obtained without providing a color filter in the imaging element.

Further, the driving of the light source device 434 may be controlled so as to change the intensity of the output light every predetermined time. By controlling the driving of the imaging element of the camera head 414 in synchronization with the timing of changing the intensity of the light to acquire an image in a time-division manner and compositing the image, it is possible to generate an image of a high dynamic range without so-called blacked up shadows and blown out highlights.

The light source device 434 may be configured to be capable of supplying light in a predetermined wavelength band corresponding to the special light observation. In the special light observation, for example, wavelength dependency of light absorption in body tissue is utilized. Specifically, a predetermined tissue such as a blood vessel in the surface layer of the mucous is imaged with high contrast by irradiating light in a narrower band compared to the irradiation light (i.e., white light) during normal observation. Alternatively, in the special light observation, fluorescence observation for obtaining an image by fluorescence generated by irradiation with excitation light may be performed. In the fluorescence observation, the body tissue may be irradiated with excitation light to observe fluorescence from the body tissue, or a reagent such as indocyanine green (ICG) may be locally poured into the body tissue, and the body tissue may be irradiated with excitation light corresponding to the fluorescence wavelength of the reagent to obtain a fluorescence image. The light source device 434 may be configured to supply narrowband light and/or excitation light corresponding to such special light observation.

As described above, according to the present embodiment, by configuring the endoscopic surgical system using the photoelectric conversion device according to any one of the first to third embodiments, it is possible to realize an endoscopic surgical system capable of acquiring images of better quality.

Seventh Embodiment

Figure 19A:
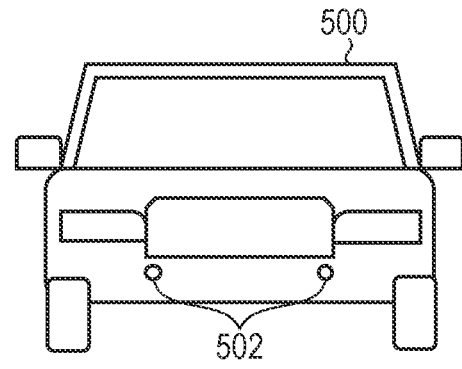
FIG. 19A, FIG. 19B, and FIG. 19C are schematic diagrams illustrating a configuration example of a movable object according to a seventh embodiment.
Figure 19B:
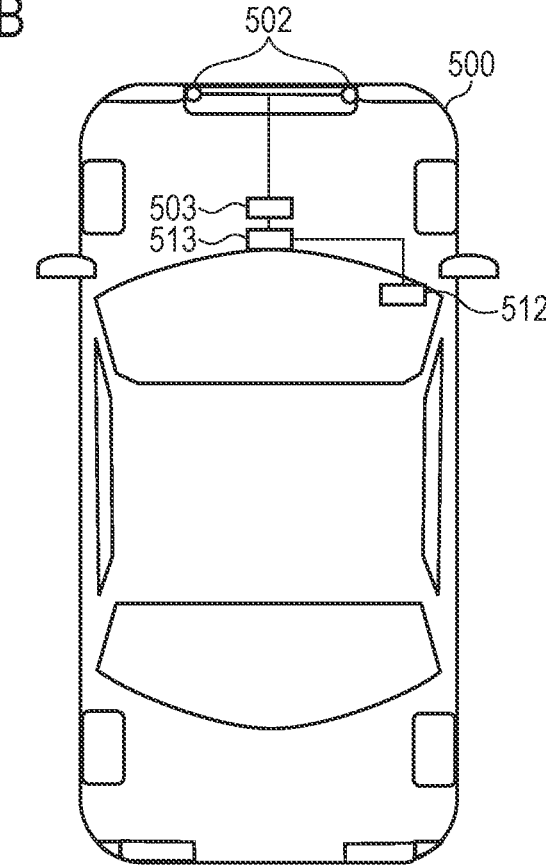
Figure 19C:
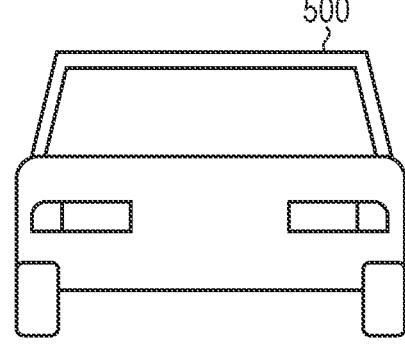
Figure 20:
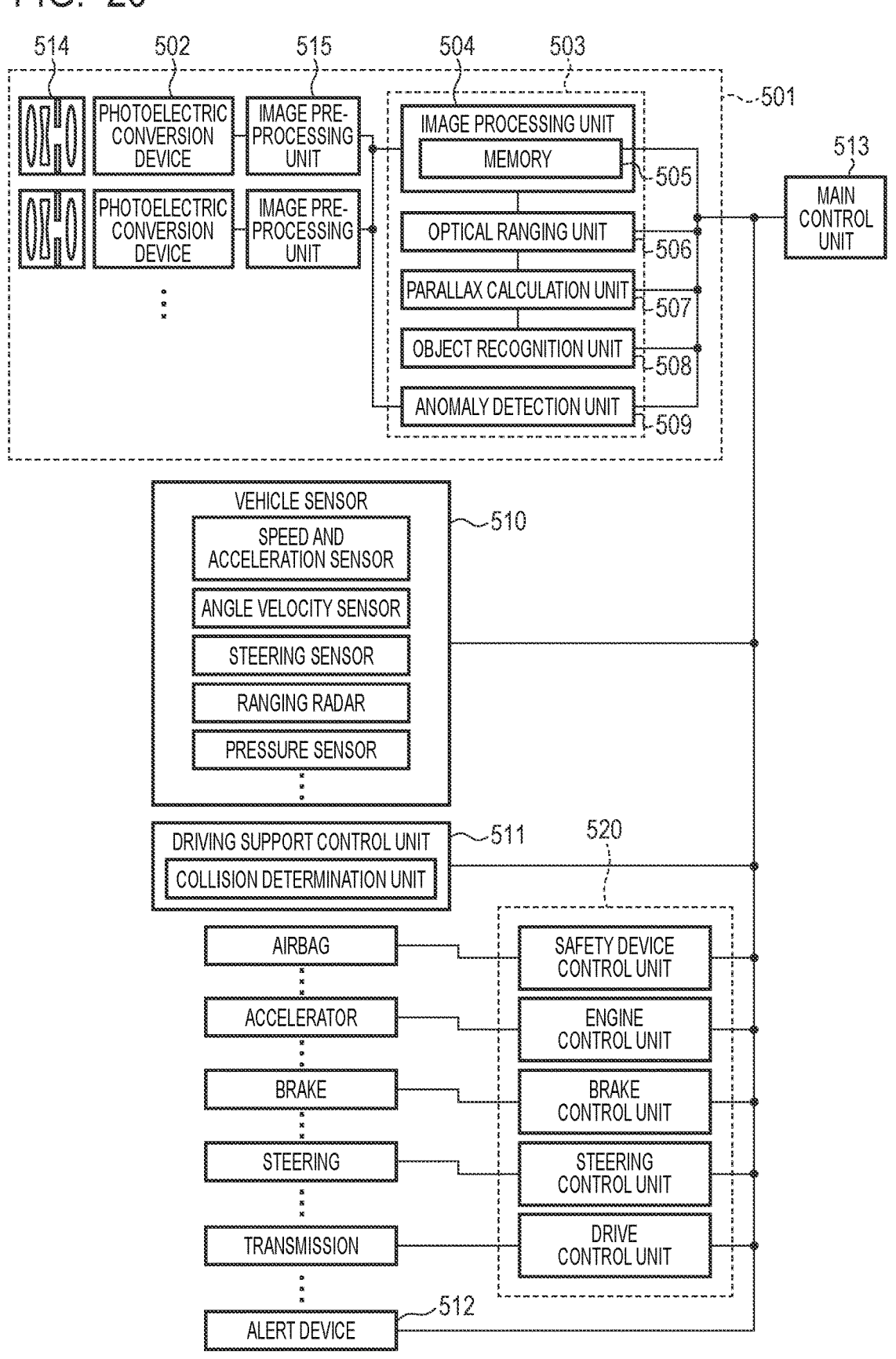
FIG. 20 is a block diagram illustrating a schematic configuration of a photodetection system according to the seventh embodiment.
Figure 21:
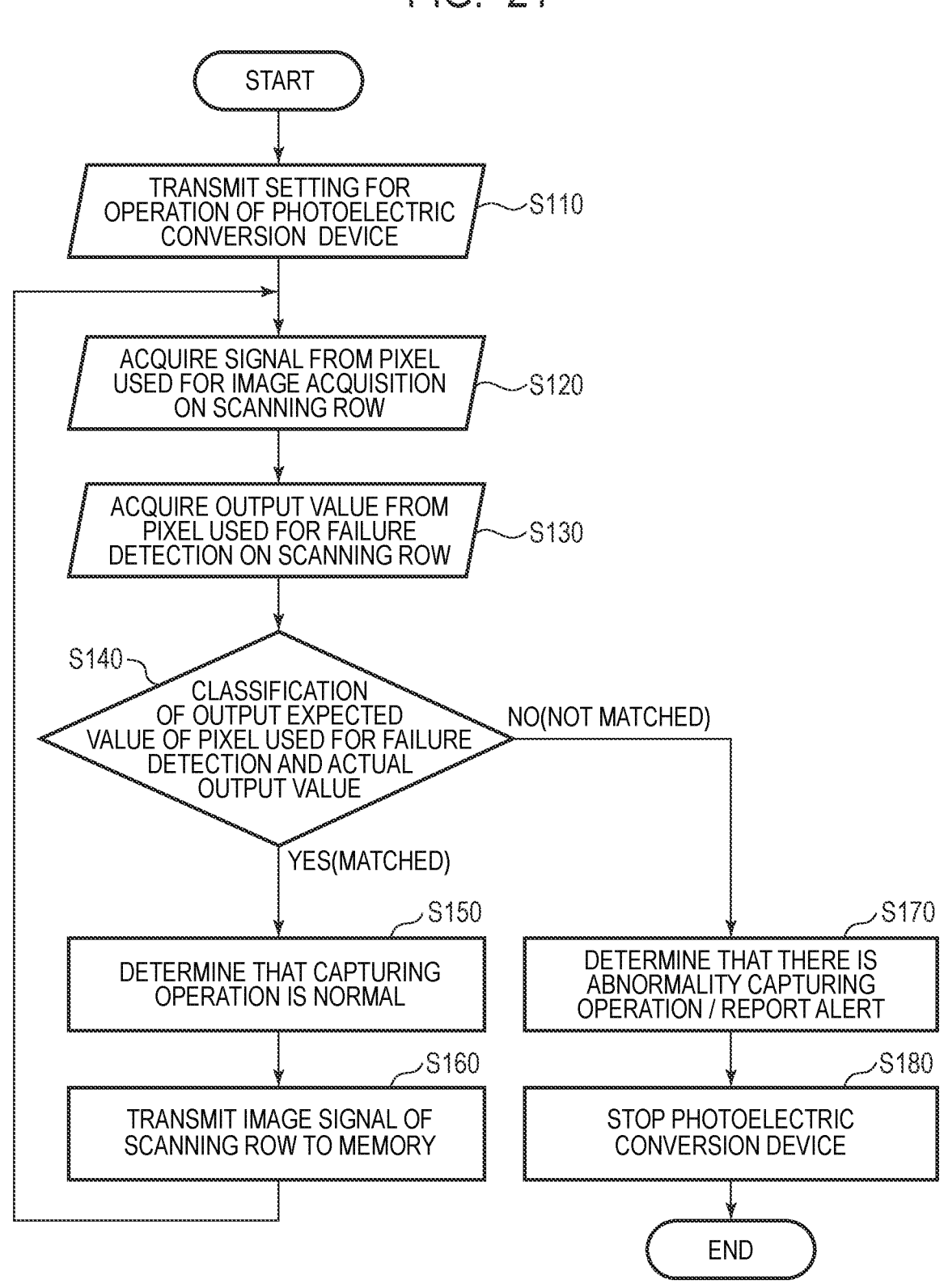
FIG. 21 is a flowchart illustrating an operation of the photodetection system according to the seventh embodiment.

A photodetection system and a movable object according to a seventh embodiment will be described with reference to FIG. 19A to FIG. 21. FIG. 19A to FIG. 19C are schematic diagrams illustrating a configuration example of the movable object according to the present embodiment. FIG. 20 is a block diagram illustrating a schematic configuration of the photodetection system according to the present embodiment. FIG. 21 is a flowchart illustrating an operation of the photodetection system according to the present embodiment. In the present embodiment, an application example to an on-vehicle camera will be described as a photodetection system to which the photoelectric conversion device 100 according to any one of the first to third embodiments is applied.

FIG. 19A to FIG. 19C are schematic diagrams illustrating a configuration example of a movable object (a vehicle system) according to the present embodiment. FIG. 19A to FIG. 19C illustrate a configuration of a vehicle 500 (e.g., an automobile) as an example of a vehicle system incorporating a photodetection system to which the photoelectric conversion device 100 according to any one of the first to third embodiments is applied. FIG. 19A is a schematic front view of the vehicle 500, FIG. 19B is a schematic plan view of the vehicle 500, and FIG. 19C is a schematic rear view of the vehicle 500. The vehicle 500 includes a pair of photoelectric conversion devices 502 on the front side thereof. Here, the photoelectric conversion device 502 is the photoelectric conversion device 100 described in any of the first to third embodiments. The vehicle 500 includes an integrated circuit 503, an alert device 512, and a main control unit 513.

FIG. 20 is a block diagram illustrating a configuration example of a photodetection system 501 mounted on the vehicle 500. The photodetection system 501 includes a photoelectric conversion device 502, an image preprocessing unit 515, an integrated circuit 503, and an optical system 514. The photoelectric conversion device 502 is the photoelectric conversion device 100 described in any of the first to third embodiments. The optical system 514 forms an optical image of an object on the photoelectric conversion device 502. The photoelectric conversion device 502 converts the optical image of the object formed by the optical system 514 into an electric signal. The image preprocessing unit 515 performs predetermined signal processing on the signal output from the photoelectric conversion device 502. The function of the image preprocessing unit 515 may be incorporated in the photoelectric conversion device 502. The photodetection system 501 is provided with at least two sets of the optical system 514, the photoelectric conversion device 502, and the image preprocessing unit 515, and outputs from the image preprocessing units 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image preprocessing unit 515. For example, the image processing unit 504 performs image processing such as development processing and defect correction on the output signal of the image preprocessing unit 515. The image processing unit 504 includes a memory 505 for temporarily storing image signals. The memory 505 may store, for example, the position of a known defective pixel in the photoelectric conversion device 502.

The optical ranging unit 506 performs focusing and distance measurement of an object. The parallax calculation unit 507 calculates distance measurement information (distance information) from a plurality of image data (parallax images) acquired by a plurality of photoelectric conversion devices 502. Each of the photoelectric conversion devices 502 may have a configuration capable of acquiring various kinds of information such as distance information. The object recognition unit 508 recognizes an object such as a vehicle, a road, a marker, or a person.

When the abnormality detection unit 509 detects the abnormality of the photoelectric conversion device 502, the abnormality detection unit 509 notifies the main control unit 513 of the abnormality.

The integrated circuit 503 may be implemented by dedicated hardware, software modules, or a combination thereof. Further, it may be implemented by FPGA (Field Programmable Gate Array), ASIC (Application Specific Integrated Circuit), or the like, or may be implemented by a combination of these.

The main control unit 513 collectively controls the operations of the photodetection system 501, the vehicle sensor 510, the control unit 520, and the like. The vehicle 500 may not include the main control unit 513.

In this case, the photoelectric conversion device 502, the vehicle sensor 510, and the control unit 520 transmit and receive control signals via a communication network. For example, the CAN (Controller Area Network) standard may be applied to transmit and receive the control signals.

The integrated circuit 503 has a function of receiving a control signal from the main control unit 513 or transmitting a control signal and a setting value to the photoelectric conversion device 502 by its own control unit.

The photodetection system 501 is connected to the vehicle sensor 510, and may detect a traveling state of the own vehicle such as a vehicle speed, a yaw rate, a steering angle, and the like, an environment outside the own vehicle, and states of other vehicles and obstacles.

The vehicle sensor 510 is also a distance information acquisition means for acquiring distance information to the object. The photodetection system 501 is connected to a driving support control unit 511 that performs various driving support functions such as an automatic steering function, an automatic cruising function, and a collision prevention function. In particular, with regard to the collision determination function, based on the detection results of the photodetection system 501 and the vehicle sensor 510, it is determined whether or not there is a collision with another vehicle or an obstacle. Thus, avoidance control when a collision is estimated and activation of the safety device at the time of collision are performed.

The photodetection system 501 is also connected to an alert device 512 that issues an alert to the driver based on the determination result of the collision determination unit. For example, when the collision possibility is high as the determination result of the collision determination unit, the main control unit 513 performs vehicle control to avoid collision and reduce damage by braking, returning an accelerator, suppressing engine output, or the like. The alert device 512 alerts a user by sounding an alarm such as a sound, displaying alert information on a display screen of a car navigation system or a meter panel, or applying vibration to a seat belt or a steering wheel.

In the present embodiment, the photodetection system 501 images the periphery of the vehicle, for example, the front side or the rear side. FIG. 19B illustrates an example of the arrangement of the photodetection system 501 when the photodetection system 501 captures an image in front of the vehicle.

As described above, the photoelectric conversion device 502 is disposed in front of the vehicle 500. More specifically, when a center line with respect to a forward/backward direction of the vehicle 500 or an outer shape (e.g., a vehicle width) is regarded as a symmetry axis, and two photoelectric conversion devices 502 are disposed symmetrically with respect to the symmetry axis, it is preferable to acquire distance information between the vehicle 500 and an object to be imaged and to determine a collision possibility. Further, it is preferable that the photoelectric conversion device 502 is disposed so as not to obstruct the field of view of the driver when the driver sees a situation outside the vehicle 500 from the driver's seat. The alert device 512 is preferably arranged to be easy to enter the field of view of the driver.

Next, a failure detection operation of the photoelectric conversion device 502 in the photodetection system 501 will be described with reference to FIG. 21. The failure detection operation of the photoelectric conversion device 502 may be performed according to steps S110 to S180 illustrated in FIG. 21.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, pixel signals are acquired from the effective pixels. In step S130, an output value from the failure detection pixel provided for failure detection is acquired. The failure detection pixel includes a photoelectric conversion element as in the case of the effective pixel. A predetermined voltage is written to the photoelectric conversion element. The failure detection pixel outputs a signal corresponding to the voltage written to the photoelectric conversion element. Step S120 and step S130 may be reversed.

Next, in step S140, a classification of the output expected value of the failure detection pixel and the actual output value from the failure detection pixel is performed. As a result of the classification in step S140, when the output expected value matches the actual output value, the process proceeds to step S150, it is determined that the imaging operation is normally performed, and the process proceeds to step S160. In step S160, the pixel signals of the scanning row are transmitted to the memory 505 to temporarily store them. After that, the process returns to step S120 to continue the failure detection operation. On the other hand, as a result of the classification in step S140, when the output expected value does not match the actual output value, the processing step proceeds to step S170. In step S170, it is determined that there is an abnormality in the imaging operation, and an alert is notified to the main control unit 513 or the alert device 512. The alert device 512 causes the display unit to display that an abnormality has been detected. Thereafter, in step S180, the photoelectric conversion device 502 is stopped, and the operation of the photodetection system 501 is terminated.

Although the present embodiment exemplifies the example in which the flowchart is looped for each row, the flowchart may be looped for each plurality of rows, or the failure detection operation may be performed for each frame. The alert of step S170 may be notified to the outside of the vehicle via the wireless network.

Further, in the present embodiment, the control in which the own vehicle does not collide with other vehicles has been described, but the disclosure is also applicable to a control in which the own vehicle is automatically driven following the other vehicles, a control in which the own vehicle is automatically driven so as not to go out of the lane, and the like. Further, the photodetection system 501 may be applied not only to a vehicle such as an own vehicle but also to, for example, other movable object (moving devices) such as a ship, an aircraft, or an industrial robot. In addition, the disclosure may be widely applied not only to a movable object, but also to equipment using object recognition such as an ITS (Intelligent Transport Systems).

Eighth Embodiment

Figure 22A:
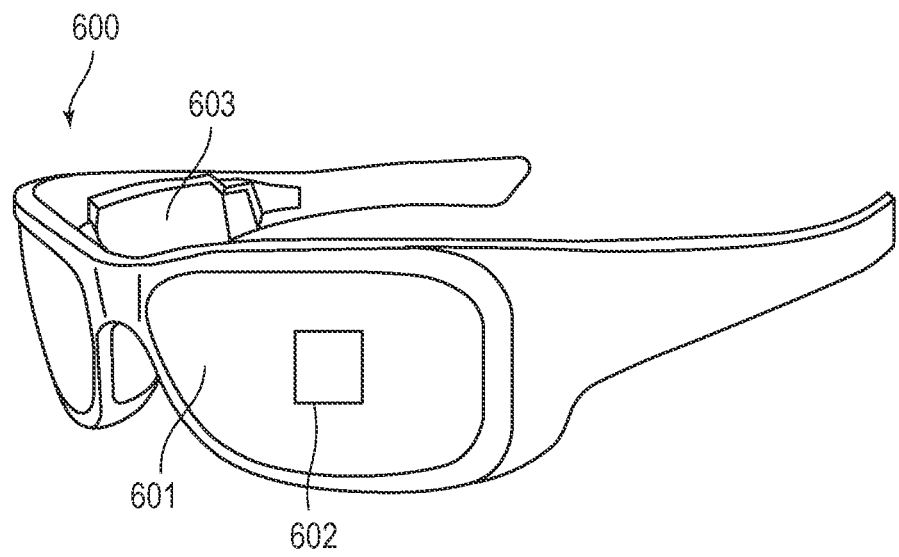
FIG. 22A and FIG. 22B are schematic diagrams illustrating a schematic configuration of a photodetection system according to an eighth embodiment.
Figure 22B:
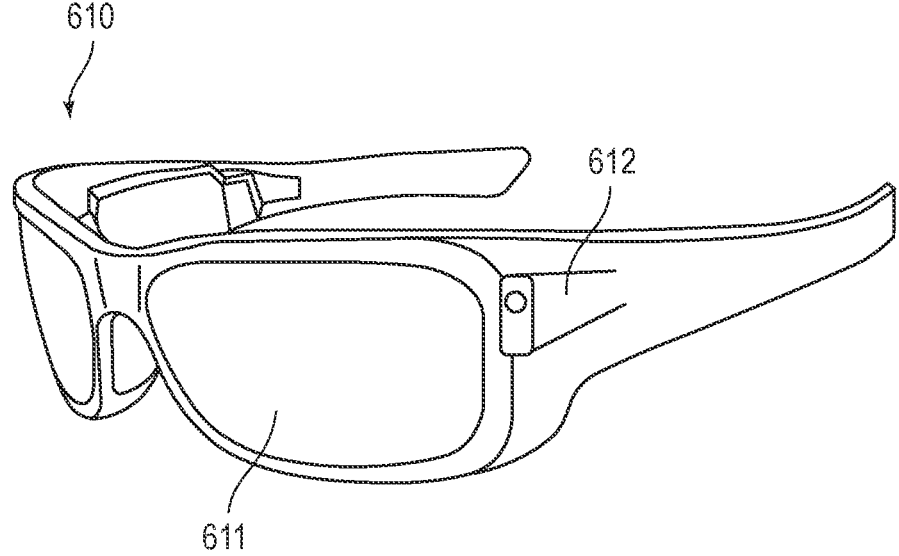

A photodetection system according to an eighth embodiment will be described with reference to FIG. 22A and FIG. 22B. FIG. 22A and FIG. 22B are schematic diagrams illustrating a configuration example of the photodetection system according to the present embodiment. In the present embodiment, an application example to eyeglasses (smartglasses) will be described as a photodetection system to which the photoelectric conversion device 100 according to any one of the first to third embodiments is applied.

FIG. 22A illustrates eyeglasses 600 (smartglasses) according to one application example. The eyeglasses 600 include a lens 601, a photoelectric conversion device 602, and a control device 603.

The photoelectric conversion device 602 is the photoelectric conversion device 100 described in any of the first to third embodiments, and is provided on the lens 601. One photoelectric conversion device 602 or a plurality of photoelectric conversion devices 602 may be provided on the lens 601. When the plurality of photoelectric conversion devices 602 is used, a plurality of types of photoelectric conversion devices 602 may be used in combination. The arrangement position of the photoelectric conversion device 602 is not limited to FIG. 22A. A display device (not illustrated) including a light emitting device such as an OLED (Organic Light Emitting Diode) or an LED (Light Emitting Diode) may be provided on the rear surface side of the lens 601.

The control device 603 functions as a power supply for supplying power to the photoelectric conversion device 602 and the display device. The control device 603 has a function of controlling the operation of the photoelectric conversion device 602 and the display device. The lens 601 is provided with an optical system for focusing light on the photoelectric conversion device 602.

FIG. 22B illustrates eyeglasses 610 (smartglasses) according to another application example. The eyeglasses 610 include lenses 611 and a control device 612. A photoelectric conversion device corresponding to the photoelectric conversion device 602 and a display device (not illustrated) may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operation of the photoelectric conversion device and the display device.

The control device 612 may further include a line-of-sight detection unit that detects the line of sight of the wearer. In this case, an infrared light emitting unit is provided in the control device 612, and infrared light emitted from the infrared light emitting unit may be used for detection of a line of sight. Specifically, the infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality may be reduced.

The line of sight of the user with respect to the display image may be detected from the captured image of the eyeball obtained by capturing the infrared light. Any known method may be applied to the line-of-sight detection using the captured image of the eyeball. As an example, a line-of-sight detection method based on a Purkinje image caused by reflection of irradiation light on the cornea may be used. More specifically, a line-of-sight detection processing based on the pupil cornea reflection method is performed. By using the pupil cornea reflection method, a line-of-sight vector representing the direction (rotation angle) of the eyeball is calculated based on the image of the pupil image and the Purkinje image included in the captured image of the eyeball, whereby the line of sight of the user is detected.

The display device of the present embodiment may include a photoelectric conversion device having a light receiving element, and may be configured to control a display image based on line-of-sight information of a user from the photoelectric conversion device. Specifically, the display device determines a first viewing area to be gazed by the user and a second viewing area other than the first viewing area based on the line-of-sight information. The first viewing area and the second viewing area may be determined by a control device of the display device, or may be determined by an external control device. When an external control device determines, the determination result is transmitted to a display device via communication. In the display region of the display device, the display resolution of the first viewing area may be controlled to be higher than the display resolution of the second viewing area. That is, the resolution of the second viewing area may be lower than the resolution of the first viewing area.

Further, the display area may have a first display area and a second display area different from the first display area, and may be configured to determine an area having a high priority from the first display area and the second display area based on the line-of-sight information. The first display area and the second display area may be determined by a control device of the display device, or may be determined by an external control device. When an external control device determines, the determination result is transmitted to a display device via communication. The resolution of the region with high priority may be controlled to be higher than the resolution of the region other than the region with high priority. That is, the resolution of an area having a relatively low priority may be reduced.

An apparatus, device, or functionality using AI (Artificial Intelligence) may be used to determine the first viewing area or the area with high priority. The AI may be a model configured to estimate an angle of a line of sight and a distance to a target object ahead of the line of sight from an image of an eyeball, using an image of the eyeball and a direction in which the eyeball of the image is actually viewed as teacher data. The AI program may be held by the display device, the photoelectric conversion device, or an external device. When the external device has, the information is transmitted to the display device via communication.

When the display control is performed based on the visual recognition detection, the disclosure may be preferably applied to smartglasses which further include a photoelectric conversion device for capturing an image of the outside. The smartglasses may display captured external information in real time.

Modified Embodiments

The disclosure is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the disclosure.

The circuit configuration of the pixel 12 is not limited to the above-described embodiments. For example, a switch such as a transistor may be provided between the photoelectric conversion unit 20 and the quenching element 32 or between the photoelectric conversion unit 20 and the signal processing circuit unit 30 to control an electrical connection state therebetween. Further, a switch such as a transistor may be provided between the node to which the voltage VH is supplied and the quenching element 32 and/or between the node to which the voltage VL is supplied and the photoelectric conversion unit 20 to control an electrical connection state therebetween. Further, a plurality of photoelectric conversion units 20 may be provided for one pixel 12.

Although the counter circuit 36 is used as the signal processing circuit unit 30 in the above-described embodiments, a TDC (Time to Digital Converter) and a memory may be used instead of the counter circuit 36. In this case, the generation timing of the pulse signal output from the waveform shaping circuit 34 is converted into a digital signal by the TDC. A control pulse pREF (reference signal) is supplied from the vertical scanning circuit unit 40 to the TDC via the control line 14 when the timing of the pulse signal is measured. The TDC acquires a signal indicating a relative time of the input timing of the signal output from each pixel 12 with reference to the control pulse pREF as a reference as a digital data.

Further, in the above-described embodiments, a configuration in which light to be detected is incident from the side of the second surface 124 of the semiconductor layer 120, that is, a so-called back-illuminated-type photoelectric conversion device is described, but the photoelectric conversion device may be configured such that light to be detected is incident from the side of the first surface 122 of the semiconductor layer 120.

According to the disclosure, it is possible to realize a photoelectric conversion device capable of greatly reducing the dark output due to dark electrons without lowering the sensitivity, the saturation signal amount, and the reliability.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)$^T$M), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-024211, filed Feb. 20, 2023, which is hereby incorporated by reference herein in its entirety.

What is claimed is:

1. A photoelectric conversion device comprising:
a photoelectric conversion unit including
   a first semiconductor region of a first conductivity type having carriers of same polarity as a signal charge as majority carriers,
   a second semiconductor region of a second conductivity type forming a p-n junction with the first semiconductor region, and
   a third semiconductor region of the first conductivity type forming a p-n junction with the second semiconductor region; and
a control circuit configured to switch a reverse bias voltage, applied between the first semiconductor region and the second semiconductor region, between a first voltage and a second voltage larger than the first voltage,
wherein the photoelectric conversion device is configured to perform a signal accumulation operation period of accumulating a signal charge generated by an incidence of a photon on the photoelectric conversion unit in the third semiconductor region by setting the reverse bias voltage to the first voltage less than a breakdown voltage of the p-n junction between the first semiconductor region and the second semiconductor region, and a signal readout operation period of enabling a transfer of the signal charge from the third semiconductor region to the first semiconductor region and an avalanche multiplication at the p-n junction between the first semiconductor region and the second semiconductor region by setting the reverse bias voltage to the second voltage greater than the breakdown voltage, and wherein the control circuit is configured to switch the reverse bias voltage between the first voltage and the second voltage by changing a waveform in a rectangular shape.

2. The photoelectric conversion device according to claim 1, further comprising:

an avalanche multiplication detection circuit configured to detect an avalanche multiplication occurred at the p-n junction between the first semiconductor region and the second semiconductor region, wherein the photoelectric conversion device is configured to repeatedly perform the signal accumulation operation period and the signal readout operation period a plurality of times, and count the number of times of the avalanche multiplication detected by the avalanche multiplication detection circuit.

3. The photoelectric conversion device according to claim 1, wherein the control circuit is configured to repeatedly perform a plurality of unit periods each including the signal accumulation operation period and the signal readout operation period during one frame period.

4. The photoelectric conversion device according to claim 2, further comprising: a counter configured to count the number of times of avalanche multiplication detected by the avalanche multiplication detection circuit during one frame period.

5. The photoelectric conversion device according to claim 1, wherein a transition time required for switching between the first voltage and the second voltage is 100 ns or less.

6. The photoelectric conversion device according to claim 1, wherein a length of the signal readout operation period is equal to or less than $1/100$ of a length of the signal accumulation operation period.

7. The photoelectric conversion device according to claim 1, wherein a length of the signal accumulation operation period is set such that the number of signal charge generated by an incident of a photon on the photoelectric conversion unit is at most one.

8. The photoelectric conversion device according to claim 2, wherein the avalanche multiplication detection circuit is configured to output one pulse signal indicating an occurrence of avalanche multiplication regardless of the number of occurrences of the avalanche multiplication, when one or more avalanche multiplications occur during the signal readout operation period.

9. The photoelectric conversion device according to claim 2, wherein the first voltage is a voltage that forms a potential barrier in the second semiconductor region that prevents the signal charge from being transferred from the third semiconductor region to the first semiconductor region.

10. The photoelectric conversion device according to claim 1, wherein, in a transitional state in which the reverse bias voltage is switched from the first voltage to the second voltage, the reverse bias voltage when a transfer of the signal charge accumulated in the third semiconductor region to the first semiconductor region is started is a voltage greater than the breakdown voltage by 1 V or more.

11. The photoelectric conversion device according to claim 2, wherein, in a transitional state in which the reverse bias voltage is switched from the first voltage to the second voltage, the avalanche multiplication detection circuit is configured to enable detection of avalanche multiplication when the reverse bias voltage reaches a voltage at which a transfer of the signal charge accumulated in the third semiconductor region to the first semiconductor region is started.

12. The photoelectric conversion device according to claim 1, wherein the control circuit is configured to control the reverse bias voltage by controlling a potential of the first semiconductor region.

13. The photoelectric conversion device according to claim 2, further comprising: a quenching element connected between an output node of the photoelectric conversion unit and the avalanche multiplication detection circuit.

14. The photoelectric conversion device according to claim 2, further comprising:
a first switch provided between an output node of the photoelectric conversion unit and an input node of the avalanche multiplication detection circuit,
wherein the first switch is configured to be controlled to be in a non-conductive state during the signal accumulation operation period and to be in a conductive state during the signal readout operation period.

15. The photoelectric conversion device according to claim 14, further comprising:
a second switch provided between the output node of the photoelectric conversion unit and a node to which a predetermined fixed voltage is supplied,
wherein the second switch is configured to be controlled to be in a non-conductive state during the signal readout operation period and to be in a conductive state during the signal accumulation operation period.

16. The photoelectric conversion device according to claim 1,
wherein the photoelectric conversion device includes a plurality of pixels arranged to form a plurality of rows and a plurality of columns, and wherein each of the plurality of pixels includes the photoelectric conversion unit, and a signal processing circuit unit including an avalanche multiplication detection circuit configured to detect avalanche multiplication occurred in the p-n junction between the first semiconductor region and the second semiconductor region.

17. The photoelectric conversion device according to claim 16, further comprising:
a first substrate provided with a semiconductor layer including the photoelectric conversion unit of each of the plurality of pixels; and
a second substrate provided with the signal processing circuit unit of each of the plurality of pixels.

18. A photodetection system comprising:
a photoelectric conversion device according to claim 1; and
a signal processing device configured to process a signal output from the photoelectric conversion device.

19. The photodetection system according to claim 18, wherein the signal processing device generates a distance image representing distance information to an object based on the signal.

20. A movable object comprising:
a photoelectric conversion device according to claim 1;
a distance information acquisition unit configured to acquire distance information to an object from a parallax image based on a signal output from the photoelectric conversion device; and
a control unit configured to control the movable object based on the distance information.

21. The photoelectric conversion device according to claim 1, further comprising:
a first switch connected between the first semiconductor region and a first power supply voltage node; and
a second switch connected between the first semiconductor region and a second power supply voltage node,
wherein the first voltage and the second voltage are switched by switching a state in which the first switch is on-state and the second switch is off-state and a state in which the first switch is off-state and the second switch is on-state.

* * * * *